US010515974B2

(12) United States Patent
Lee et al.

(10) Patent No.: US 10,515,974 B2
(45) Date of Patent: Dec. 24, 2019

(54) SEMICONDUCTOR DEVICE

(71) Applicant: Samsung Electronics Co., Ltd., Suwon-si (KR)

(72) Inventors: Byoung Il Lee, Seoul (KR); Ji Mo Gu, Seoul (KR); Tak Lee, Hwaseong-si (KR); Jun Ho Cha, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/925,365

(22) Filed: Mar. 19, 2018

(65) Prior Publication Data
US 2018/0374862 A1 Dec. 27, 2018

(30) Foreign Application Priority Data
Jun. 21, 2017 (KR) .................. 10-2017-0078530

(51) Int. Cl.
H01L 27/11556 (2017.01)
H01L 27/11582 (2017.01)
(Continued)

(52) U.S. Cl.
CPC .... H01L 27/11556 (2013.01); H01L 27/1157 (2013.01); H01L 27/11529 (2013.01);
(Continued)

(58) Field of Classification Search
None
See application file for complete search history.

(56) References Cited

U.S. PATENT DOCUMENTS 9,214,409 B2  12/2015  Yoo et al.
9,306,040 B2   4/2016  Choi et al.
(Continued)

FOREIGN PATENT DOCUMENTS

CN    106876397 A    6/2017
KR   2014-0063147 A   5/2014
KR   2015-0116995 A  10/2015

OTHER PUBLICATIONS

Search Report and Written Opinion from the Intellectual Property Office of Singapore for corresponding application SG-10201805238R, dated Dec. 10, 2018.

Primary Examiner — Telly D Green
(74) Attorney, Agent, or Firm — Muir Patent Law, PLLC

(57) ABSTRACT

A semiconductor device includes a substrate having first and second regions, a gate electrode stack having a plurality of gate electrodes vertically stacked and spaced apart from each other in a first direction perpendicular to an upper surface of the substrate in the first region, and extending to have different lengths in a second direction parallel to the upper surface of the substrate from the first region to the second region, first and second isolation regions extending in the second direction perpendicular to the first direction, while penetrating through the gate electrode stack on the substrate, in the first and second regions, string isolation regions disposed between the first and second isolation regions in the first region, and extending in the second direction while penetrating through a portion of the gate electrode stack, and a plurality of auxiliary isolation regions disposed linearly with the string isolation regions in at least one of the first and second regions, and spaced apart from each other in the second direction.

15 Claims, 22 Drawing Sheets

(51) Int. Cl.
    *H01L 27/11529* (2017.01)
    *H01L 27/11548* (2017.01)
    *H01L 27/11575* (2017.01)
    *H01L 27/1157* (2017.01)
    *H01L 27/11573* (2017.01)
    *H01L 27/11565* (2017.01)

(52) U.S. Cl.
    CPC .. *H01L 27/11548* (2013.01); *H01L 27/11565* (2013.01); *H01L 27/11573* (2013.01); *H01L 27/11575* (2013.01); *H01L 27/11582* (2013.01)

(56) References Cited

U.S. PATENT DOCUMENTS

| | | | |
|---|---|---|---|
| 9,306,041 | B2 | 4/2016 | Hwang et al. |
| 9,331,091 | B1 | 5/2016 | Cernea |
| 9,349,747 | B2 * | 5/2016 | Kim ............... H01L 27/11556 |
| 9,508,730 | B2 | 11/2016 | Lee et al. |
| 2010/0078701 | A1 | 4/2010 | Shim et al. |
| 2013/0009229 | A1 | 1/2013 | Lee et al. |
| 2014/0138765 | A1 | 5/2014 | Lee et al. |
| 2014/0346682 | A1 | 11/2014 | Lee et al. |
| 2015/0137216 | A1 | 5/2015 | Lee et al. |
| 2015/0349109 | A1 | 12/2015 | Lee |
| 2015/0372101 | A1 | 12/2015 | Lee et al. |
| 2016/0035732 | A1 | 2/2016 | Lee et al. |
| 2016/0064407 | A1 * | 3/2016 | Kim ............... H01L 27/11556 |
| | | | 257/324 |
| 2016/0079254 | A1 | 3/2016 | Shimura |
| 2016/0268287 | A1 | 9/2016 | Park et al. |

\* cited by examiner

SEMICONDUCTOR DEVICE

CROSS-REFERENCE TO RELATED APPLICATION(S)

This application claims benefit of priority under 35 U.S.C § 119 to Korean Patent Application No. 10-2017-0078530 filed on Jun. 21, 2017 in the Korean Intellectual Property Office, the disclosure of which is incorporated herein by reference in its entirety.

BACKGROUND

1. Field

The present disclosure relates to a semiconductor device.

2. Description of Related Art

While semiconductor devices are required to process high capacity data, the volumes thereof have gradually been reduced. Thus, the integration of semiconductor elements constituting such semiconductor devices needs to be increased. Accordingly, as one method of improving the degree of integration of a semiconductor device, a semiconductor device having a three-dimensional transistor structure, for example, a vertical transistor structure, rather than an existing planar transistor structure, has been proposed.

SUMMARY

An aspect of the present inventive concept according to exemplary embodiments provides a semiconductor device having improved reliability.

According to an aspect of the present inventive concept, a semiconductor device includes a substrate having first and second regions; a gate electrode stack having a plurality of gate electrodes vertically stacked and spaced apart from each other in a first direction perpendicular to an upper surface of the substrate in the first region, and extending to have different lengths in a second direction parallel to the upper surface of the substrate from the first region to the second region; first and second isolation regions extending in the second direction perpendicular to the first direction, while penetrating through the gate electrode stack on the substrate, in the first and second regions; string isolation regions disposed between the first isolation region and the second isolation region in the first region, and extending in the second direction while penetrating through a portion of the gate electrode stack; and a plurality of auxiliary isolation regions disposed linearly with the string isolation regions in at least one of the first and second regions, and spaced apart from each other in the second direction.

According to an aspect of the present inventive concept, a semiconductor device includes a substrate having a first region and a second region, a plurality of gate electrodes vertically stacked and spaced apart from each other in a first direction perpendicular to an upper surface of the substrate in the first region, each of the plurality of gate electrodes extends to have different length from each other in a direction from the first region to the second region, a plurality of common source lines disposed between the plurality of gate electrodes in the first and second regions, and extending in a second direction perpendicular to the first direction, and a plurality of dummy common source lines disposed between the common source lines in at least one of the first and second regions, and spaced apart from each other in the second direction.

According to an aspect of the present inventive concept, a semiconductor device includes a substrate, gate electrodes vertically stacked and spaced apart from each other in a first direction, perpendicular to an upper surface of the substrate, each of the gate electrodes extends to have different length from each other in a second direction perpendicular to the first direction, and first and second isolation regions extending in the second direction, while penetrating through all of the gate electrodes stacked on the substrate. Among the gate electrodes, at least one uppermost gate electrode is divided into first and second subgate electrodes having a minimum width of a first length in a third direction perpendicular to the first and second directions, between the first and second isolation regions. At least one of the gate electrodes, disposed in the middle of the gate electrodes, is connected between the first and second isolation regions by a plurality of gate connection portions spaced apart from each other in the second direction. Each of the gate connection portions has a second length in the second direction, less than twice the first length.

BRIEF DESCRIPTION OF DRAWINGS

The above and other aspects, features and other advantages of the present inventive concept will be more clearly understood from the following detailed description taken in conjunction with the accompanying drawings, in which.

Figure 1:
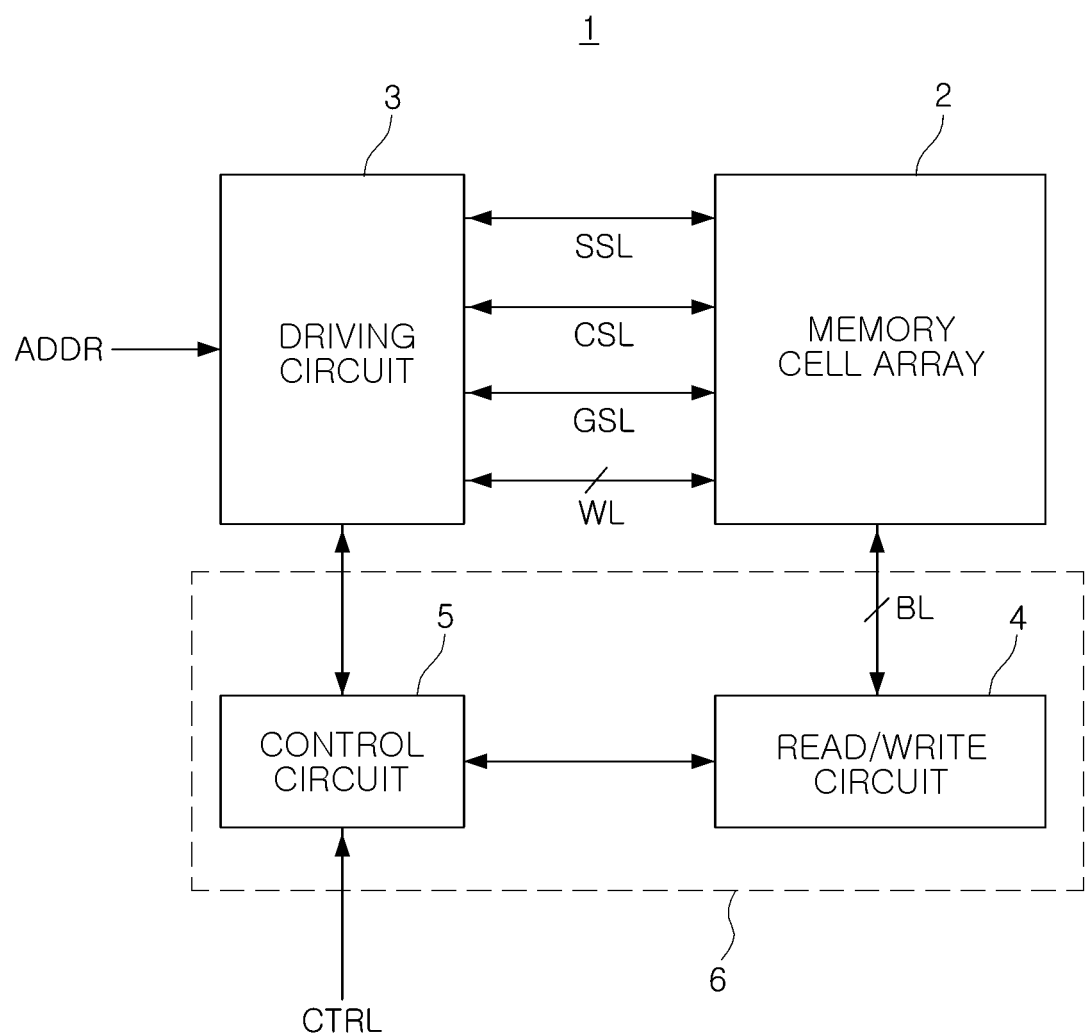
FIG. 1 is a schematic block diagram of a semiconductor device according to example embodiments.

In the drawings, the size and relative sizes of layers and regions may be exaggerated for clarity. Like numbers refer to like elements throughout. Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

FIG. 1 is a schematic block diagram of a semiconductor device according to example embodiments.

With reference to FIG. 1, a semiconductor device 1 according to an example embodiment may include a memory cell array 2, a driving circuit 3, a read/write circuit 4, and a control circuit 5. The semiconductor device 1 may be in the form of, for example, a semiconductor chip or die, formed from a semiconductor wafer. The term "semiconductor device" as used herein may also refer to a semiconductor package, including a package substrate, one or more semiconductor chips, and an encapsulant.

The memory cell array 2 may include a plurality of memory cells, and the plurality of memory cells may be arranged in a plurality of rows and columns. The plurality of memory cells included in the memory cell array 2 may be electrically connected to the driving circuit 3 through word lines WL, a common source line CSL, a string select line SSL, a ground select line GSL, and the like, and may be electrically connected to the read/write circuit 4 through bit lines BL. In example embodiments, a plurality of memory cells arranged linearly in a single row may be electrically connected to the same word line WL, and a plurality of memory cells arranged linearly in a single column may be electrically connected to the same bit line BL.

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component.

The plurality of memory cells included in the memory cell array 2 may be divided into a plurality of memory blocks. A respective memory block may include a plurality of word lines WL, a plurality of string select lines SSL, a plurality of ground select lines GSL, a plurality of bit lines BL, and at least one common source line CSL.

The driving circuit 3 and the read/write circuit 4 may be operated by the control circuit 5. In example embodiments, the driving circuit 3 may receive address information ADDR from an external source, decode the received address information ADDR to select at least a portion of the word lines WL, the common source line CSL, the string select line SSL and the ground select line GSL connected to the memory cell array. The driving circuit 3 may include a driving circuit for each of the word line WL, the common source line CSL, the string select line SSL and the ground select line GSL.

The read/write circuit 4 may select at least a portion of bit lines BL electrically connected to the memory cell array 2 in response to a command provided from the control circuit 5. The read/write circuit 4 may read data written to a memory cell electrically connected to the selected at least a portion of bit lines BL, or may write data to a memory cell electrically connected to the selected at least a portion of bit lines BL. In order to perform operations as described above, the read/write circuit 4 may include a circuit such as a page buffer, an input/output buffer, a data latch, or the like.

The control circuit 5 may control operations of the driving circuit 3 and the read/write circuit 4 in response to a control signal CTRL received by the control circuit 5 from an external source (e.g., a memory controller). The control circuit 5 may receive a control signal and an external voltage and may be operated according to the control signal that has been received. The control circuit 5 may include a voltage generator (not shown) generating voltages required for an internal operation (e.g., a program voltage, a read voltage, an erase voltage, or the like) using the external voltage. The control circuit 5 may control a read operation, a write operation and/or an erase operation in response to control signals.

For example, when reading data written to the memory cell array 2, the control circuit 5 may control operations of the driving circuit 3 to supply a voltage to the word line WL in which data to be read is stored, to perform a read operation. When the voltage for a read operation is supplied to a specific word line WL, the control circuit 5 may perform controlling operation so that the read/write circuit 4 may read data written to a memory cell electrically connected to the word line WL having received the voltage for a read operation.

For example, when data is written to the memory cell array 2, the control circuit 5 may control operations of the driving circuit 3 to supply the voltage to the word line WL to which data is to be written to perform a writing operation. When the voltage for a writing operation is supplied to a specific word line WL, the control circuit 5 may control the read/write circuit 4 to write data to a memory cell electrically connected to the word line WL to which the voltage for a writing operation has been supplied.

Figure 2:
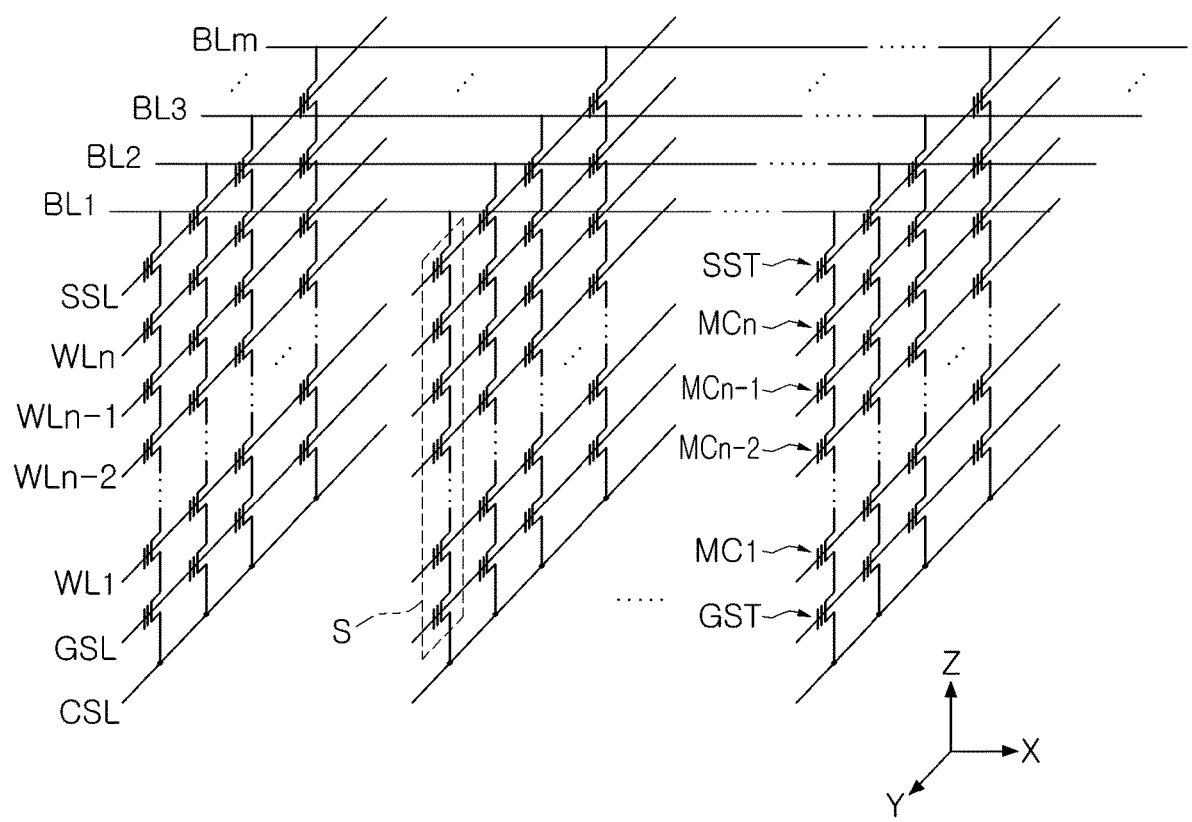
FIG. 2 is an equivalent circuit diagram of a memory cell array of a semiconductor device according to example embodiments.

FIG. 2 is an equivalent circuit diagram of a memory cell array of a semiconductor device according to example embodiments.

Referring to FIG. 2, a memory cell array according to an example embodiment may include a plurality of memory cell strings S including n number of memory cell devices MC1 to MCn connected to one another in series, and a ground select transistor GST and a string select transistor SST connected to both ends of the memory cell devices MC1 to MCn in series, respectively.

The n number of memory cell devices MC1 to MCn connected to one another in series may be connected to word lines WL1 to WLn to select at least a portion of the memory cell devices MC1 to MCn, respectively.

Gate terminals of the ground select transistors GST may be connected to a ground select line GSL, and source terminals thereof may be connected to a common source line CSL. Gate terminals of the string select transistors SST may be connected to a string select line SSL, and source terminals thereof may be connected to drain terminals of memory cell devices MCn. Although FIG. 2 illustrates a structure in which one ground select transistor GST and one string select transistor SST are respectively connected to the n number of memory cell devices MC1 to MCn connected to one another in series, in a manner different therefrom, a plurality of ground select transistors GST or a plurality of string select transistors SST may also be connected thereto.

Drain terminals of the string select transistors SST may be connected to bit lines BL1 to BLm. When a signal is applied to gate terminals of the string select transistors SST through the string select line SSL, a signal applied through the bit lines BL1 to BLm may be transferred to the n number of memory cell devices MC1 to MCn connected to one another in series, and thus, a data reading operation or a data writing operation may be performed. Further, by applying a signal to the gate terminals of the gate selection transistors GST of which source terminals are connected to the common source line CSL, via the gate select line GSL, an erase operation of removing all charges stored in the n memory cell devices MC1 to MCn may be performed.

Figure 3:
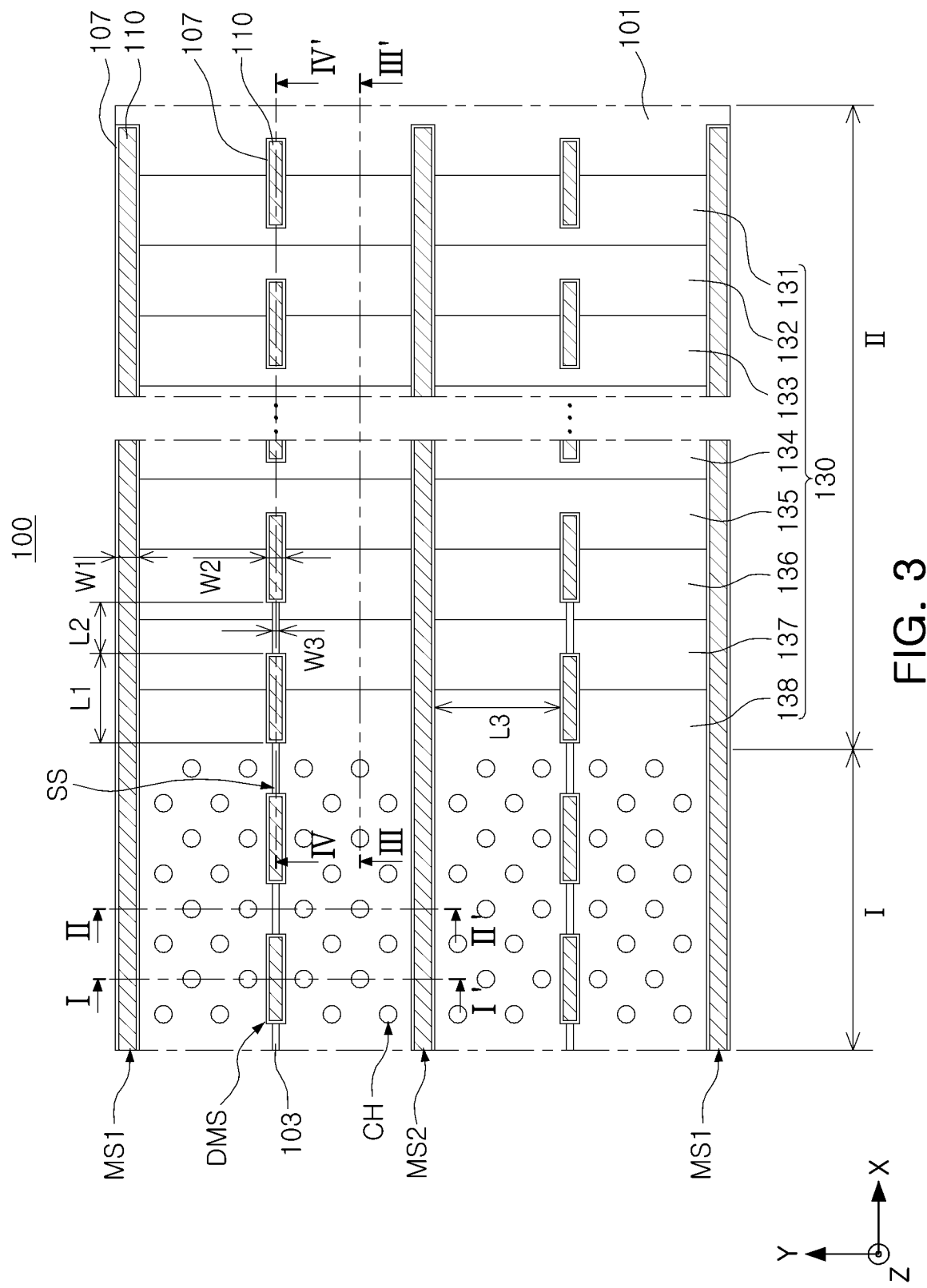
FIG. 3 is a schematic plan view of a semiconductor device according to example embodiments.

FIG. 3 is a schematic plan view of a semiconductor device according to example embodiments. FIGS. 4A to 4D are schematic cross-sectional views of a semiconductor device according to example embodiments. FIGS. 4A to 4D illustrate cross sections taken along lines I-I', II-II', III-III' and IV-IV' of FIG. 3.

With reference to FIG. 3, the semiconductor device 100 may include a substrate 101 having a first region I and a second region II, a gate electrode stack 130 having gate electrodes 131 to 138 vertically stacked on the substrate 101 in a direction (Z direction) perpendicular to an upper surface of the substrate 101, channels CH arranged to penetrate through the gate electrode stack 130 in the first region I, first and second isolation regions MS1 and MS2 extending in a first direction (X direction) parallel to an upper surface of the substrate 101 in a row direction while penetrating through the gate electrode stack 130, string isolation regions SS penetrating through portions of the gate electrode stack 130, and a plurality of auxiliary isolation regions DMS spaced apart from each other. For example, the first and second isolation regions MS1 and MS2 may extend continuously along both the first region I and the second region II. Thus, the first and second isolation regions MS1 and MS2 may be formed on the first region I and the second region II of the substrate 101. In FIG. 3, portions of components of the semiconductor device 100, for example, interlayer insulating layers 120 and a peripheral-region insulating layer 190 are omitted for the sake of brevity.

The first region I of the substrate 101 may be a region corresponding to the memory cell array 2 of FIG. 1, and the second region II may correspond to a region in which the memory cell array 2 and the driving circuit 3 of FIG. 1 are electrically connected to each other. The second region II may be disposed on at least one end of the first region I in at least one direction, for example, in an X direction.

The gate electrodes 131 to 138 of the gate electrode stack 130 may be vertically stacked in the first region I in a direction (Z direction) perpendicular to an upper surface of the substrate 101, and may extend from the first region I to the second region II to have different lengths in a direction (X direction) parallel to the upper surface of the substrate 101. The gate electrodes 131 to 138 of the gate electrode stack 130 may be divided to be disposed separately from each other in a direction (Y direction) parallel to the upper surface of the substrate 101 and perpendicular to the X and Z directions by the first and second isolation regions MS1 and MS2 extending in the X direction. The gate electrodes of the gate electrode stack 130, between the first and second isolation regions MS1 and MS2, may form a single memory block, but a range of the memory block is not limited thereto.

The channels CH may be spaced apart from each other in rows and columns on the first region I. The channels CH may be arranged to form a lattice pattern or may be arranged in a zigzag form in one direction. In example embodiments, dummy channels may be disposed on a portion of the first region I and the second region II. The dummy channels may not be connected to the bit lines. For example, a dummy channel may not be connected to any gate or bit line for communicating within the semiconductor device 100, or a dummy channel may be connected to a dummy gate or dummy bit line in a way such that data associated with active region is ignored by a peripheral circuit of the semiconductor device 100 or is not communicated to or from a device external to the semiconductor device 100, or is ignored by such an external device. Thus, "dummy" components as described herein are not used for communicating data used for logical operations or storage operations.

The first and second isolation regions MS1 and MS2 may be arranged to extend in an X direction in the first region I and the second region II. The first isolation region MS1 and the second isolation region MS2 may be alternately arranged in a Y direction perpendicular to the X direction. The first and second isolation regions MS1 and MS2 may penetrate through all of the gate electrodes 131 to 138 of the gate electrode stack 130 stacked on the substrate 101 to be connected to the substrate 101. The first and second isolation regions MS1 and MS2 may include the common source line CSL described above with reference to FIGS. 1 and 2. Each of the first and second isolation regions MS1 and MS2 may include an insulating layer 107 and a conductive layer 110 insulated from each of the gate electrodes 131 to 138 of the gate electrode stack 130 by the insulating layer 107. The conductive layers 110 of the first and second isolation regions MS1 and MS2 may correspond to the common source line CSL. For example, the conductive layer 110 of the first isolation region MS1 may correspond to a first common source line CSL1 and the conductive layer 110 of second isolation region may correspond to a second common source line CSL2 (see, e.g., FIG. 4A). In the example embodiment, the first and second isolation regions MS1 and MS2 are illustrated as having a continuous linear shape passing through the first region I and the second region II, but are not limited thereto. In example embodiments, at least one of the first and second isolation regions MS1 and MS2 may be extended discontinuously, for example, in the second region II, and may be disposed in such a manner that it is divided into two sections in the X direction. In this exemplary embodiment, a length of each of the first and second isolation regions MS1 and MS2 in the X direction may also be greater than a length of each of the auxiliary isolation regions DMS.

The string isolation regions SS may extend in the X direction between the first and second isolation regions MS1 and MS2. The string isolation regions SS may be disposed in a portion of the second region II and in the first region I, to penetrate through a portion of the gate electrode stack 130, including an uppermost gate electrode 138 among the gate electrode stack 130. The gate electrode stack 130 divided by the string isolation regions SS may be separated from each other between the channels CH arranged in a row in a Y direction, to form different string select lines SSL (see FIGS. 1 and 2). The string isolation regions SS may include a string insulation layer 103.

The auxiliary isolation regions DMS may extend in the X direction between the first and second isolation regions MS1 and MS2. The auxiliary isolation regions DMS may be disposed in a linear shape to be spaced apart from each other in the entirety of the first and second regions I and II. The auxiliary isolation regions DMS may be disposed in the linear shape together with the string isolation regions SS, and for example, may be arranged to have a center coinciding with a center of the string isolation regions SS in a Y direction. Thus, the auxiliary isolation regions DMS may be alternately arranged with the string isolation regions SS in the first region I in the X direction. In example embodiments, a portion of the auxiliary isolation regions DMS may also be arranged to be in contact with the channels CH. When an element is referred to as being "contacting" or "in contact with" another element, there are no intervening elements present.

Figure 4A:
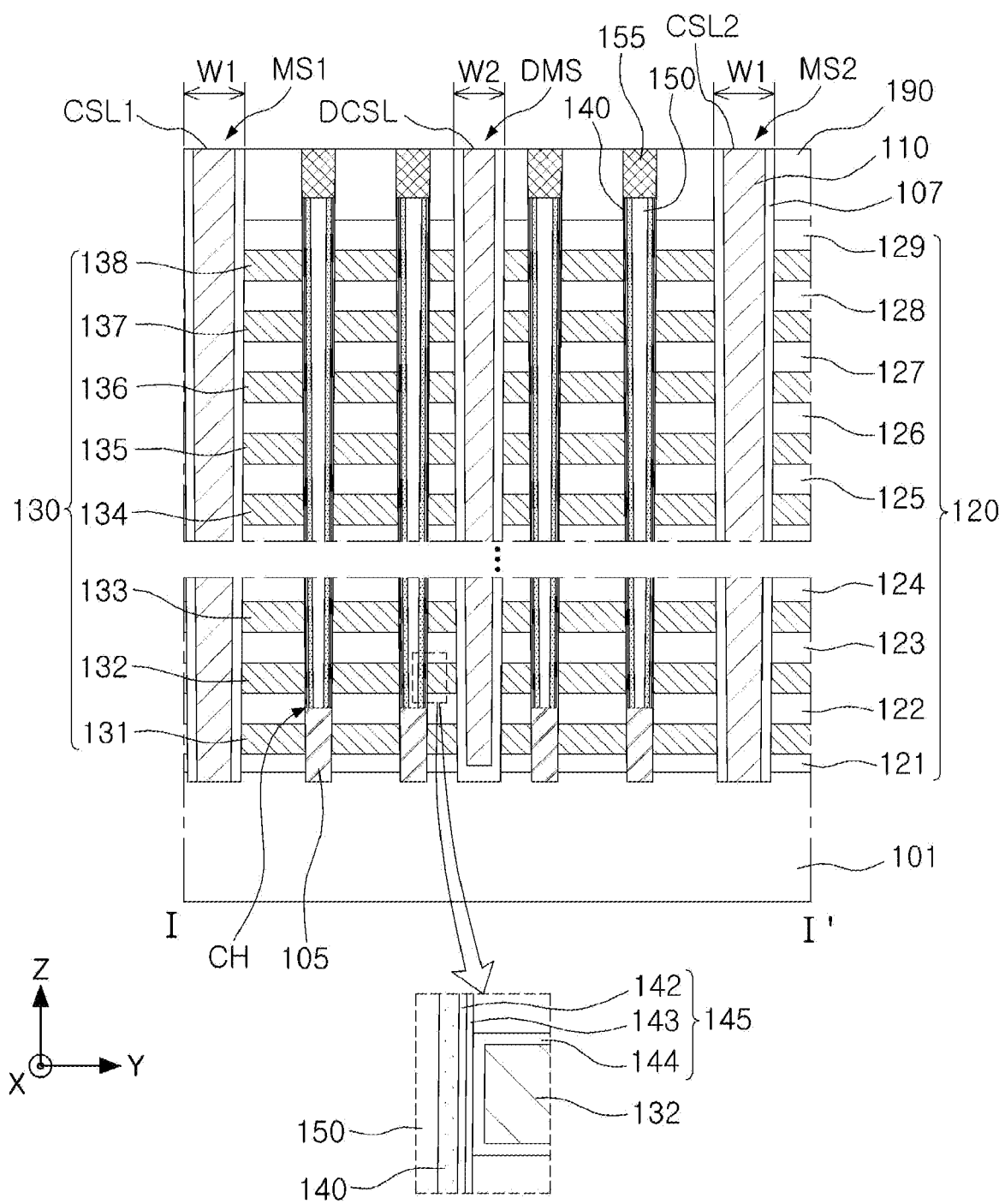
FIGS. 4A to 4D are schematic cross-sectional views of a semiconductor device according to example embodiments.

The auxiliary isolation regions DMS may include a dummy common source line DCS1 (see, e.g., FIG. 4A). The auxiliary isolation regions DMS may have a structure comprised of a conductive layer 110 and an insulating layer 107 in the same manner as the first and second isolation regions MS1 and MS2, and the conductive layer 110 in the auxiliary isolation regions DMS may correspond to a dummy common source line DCS1 (see, e.g., FIG. 4A). Thus, the conductive layers 110 constituting the auxiliary isolation regions DMS may be in a floating state in which the conductive layers 110 are not connected to devices driving the semiconductor device 100 or an electrical signal is not applied thereto, in a manner different from the conductive layers 110 of the first and second isolation regions MS1 and MS2, corresponding to the common source lines CSL. As mentioned above, the dummy common source lines as described herein are not used for communicating data used for logical operations or storage operations of the semiconductor device 100 as opposed to the common source lines CSL.

The auxiliary isolation regions DMS may be formed in the same process step as the first and second isolation regions MS1 and MS2, and may function as spaces transferring a material of the gate electrode stack 130 for formation of the gate electrode stack 130, which will be described in more detail below with reference to FIGS. 12A and 12B. In a manner different from the first and second isolation regions MS1 and MS2, as a plurality of the auxiliary isolation regions DMS are spaced apart from each other, the gate electrodes 131 to 138 of gate electrode stack 130 may be connected to each other in a region in which the auxiliary isolation regions DMS are not disposed. Thus, a stacked structure of the gate electrode stack 130 may be supported, such that leaning does not occur in the stacked structure of the gate electrode stack 130.

The shape of the auxiliary isolation regions DMS is illustrated as having a rectangular shape in plan view, but is not limited thereto, and may be variously changed within a range having an elongated shape in the X direction. The auxiliary isolation regions DMS may have a width W2 in a Y direction perpendicular to the X direction and the Z direction equal to or less than a width W1 in the Y direction perpendicular to the X direction and the Z direction of each of the first and second isolation regions MS1 and MS2. The width W2 in the Y direction perpendicular to the X direction and Z direction of each of the auxiliary isolation regions DMS may be equal to or greater than a width W3 in the Y direction perpendicular to the X direction and the Z direction of each of the string isolation regions SS. A length L1 of each of the auxiliary isolation regions DMS in an X direction may be within a range of, for example, 200 nm to 2000 nm, and may be changed according to the number of the gate electrodes of the gate electrode stack 130 and a size of the channels CH, constituting the semiconductor device 100, and the like. If the length L1 is less than the range of 200 nm to 2000 nm, patterning may be difficult to be performed in a process. If the length L1 is greater than the above range, a region in which the gate electrodes of the gate electrode stack 130 are connected to each other between the auxiliary isolation regions DMS may be relatively narrow, and thus, the stacked structure of the gate electrode stack 130 may not be sufficiently supported.

In the example embodiment, spacing distances L2 in the X direction by which the auxiliary isolation regions DMS are spaced apart from each other, for example, distances L2 between the auxiliary isolation regions DMS, may be substantially the same as each other, and may be identical to each other in the first region I and the second region II. According to example embodiments, the distances L2 may be different from each other in the first region I and the second region II, in such a manner that the auxiliary isolation regions DMS may be arranged at different densities in the first region I and the second region II. For example, in some embodiments, if the spacing distances L2 in the first region I is smaller than that of the second region II, the auxiliary isolation regions DMS may be arranged to have a higher density in the first region I than that of the second region II. Alternatively, in some embodiments, if the spacing distances L2 in the first region I is larger than that of the second region II, the auxiliary isolation regions DMS may be arranged to have a lower density in the first region I than that of the second region II. The distance L2 in the X direction may be less than twice a distance L3 in the Y direction between each of the first and second isolation regions MS1 and MS2 and the auxiliary isolation region DMS, and may be greater than 100 nm. If the distance L2 is greater than twice the distance L3, while filling of a material forming the gate electrode stack 130 between the first and second isolation regions MS1 and MS2 is completed, the filling of the material between the auxiliary isolation regions DMS may not be completed. In addition, if the distance L2 is 100 nm or less, performing patterning during a process may be difficult.

Figure 4B:
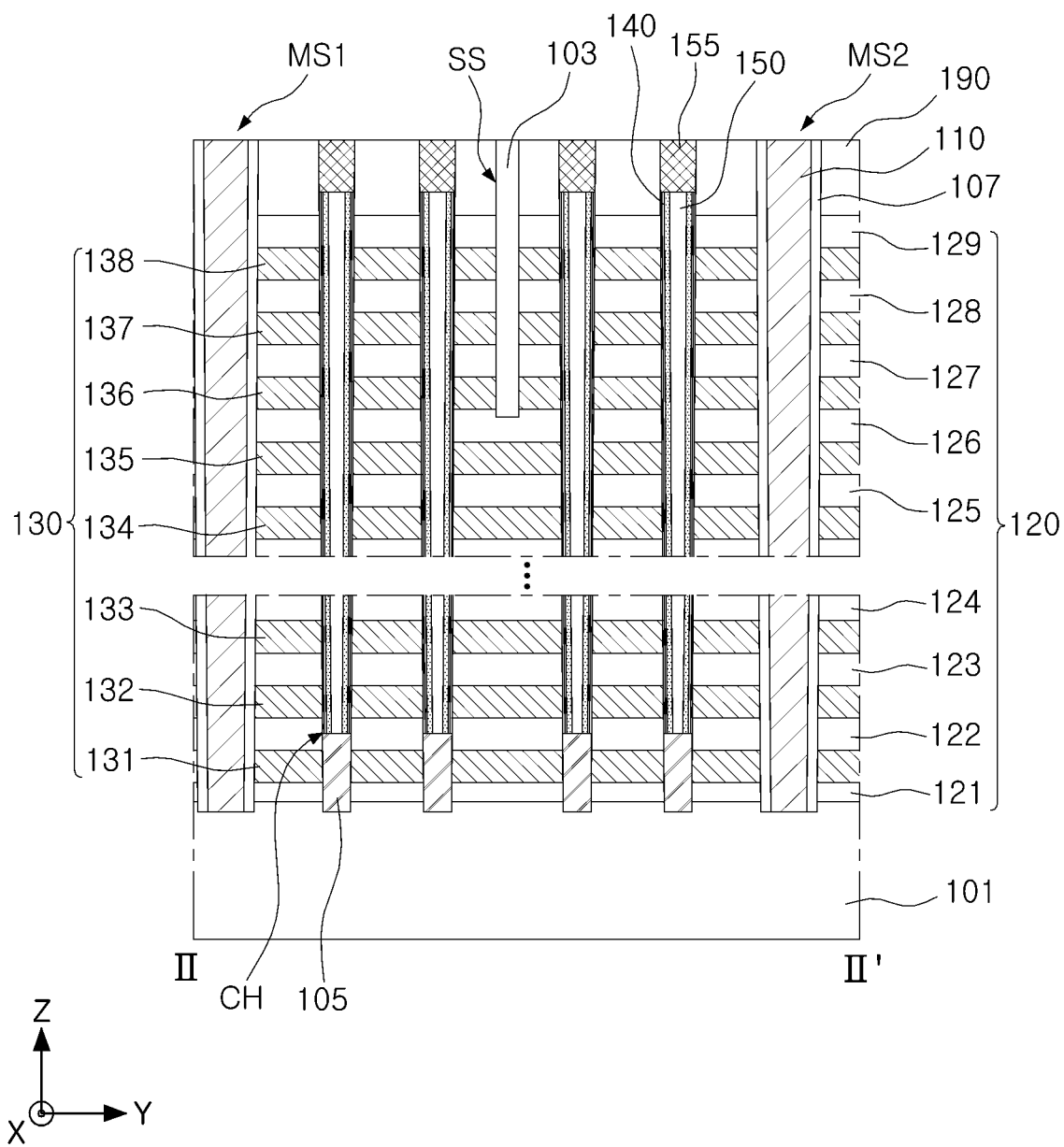

With reference to FIGS. 4A and 4B, the semiconductor device 100 may further include interlayer insulating layers 121 to 129 (120) sequentially stacked alternately with the gate electrodes 131 to 138 of the gate electrode stack 130 on the substrate 101 in a Z direction perpendicular to both X and Y directions, a gate dielectric layer 145, and a channel region 140, a channel pad 155, and a channel insulating layer 150 in the channels CH. For example, the gate electrode 131 may be disposed between the interlayer insulating layers 121 and 122, the gate electrode 132 may be disposed between the interlayer insulating layers 122 and 123, the gate electrode 133 may be disposed between the interlayer insulating layers 123 and 124, and so on.

The substrate 101 may have an upper surface extended in X and Y directions. The substrate 101 may include a semiconductor material, for example, a group IV semiconductor material, a group III-V compound semiconductor material, or a group II-VI oxide semiconductor material. For example, an example of the group IV semiconductor material may include silicon, germanium, or silicon-germanium. The substrate 101 may be provided as a bulk wafer or an epitaxial layer.

The interlayer insulating layers 120 may be disposed between the gate electrodes of the gate electrode stack 130. The interlayer insulating layers 120 may also be arranged to be spaced apart from each other in a direction perpendicular to an upper surface of the substrate 101, and may extend in an X direction, in a manner similar to the gate electrode stack 130. The interlayer insulating layers 120 may include an insulating material such as silicon oxide or silicon nitride.

The gate electrodes of the gate electrode stack 130 may be stacked on the substrate 101 in a direction perpendicular to an upper surface of the substrate 101, and may be stacked alternately with the interlayer insulating layers 121 to 129 (120). The gate electrodes of the gate electrode stack 130 may be disposed to be spaced apart from each other in a direction perpendicular to the upper surface of the substrate 101 along sides of the channels CH. Referring to FIG. 2, the gate electrodes of the gate electrode stack 130 may form gates of the ground select transistor GST, a plurality of the memory cell devices MC1 to MCn, and the string select transistor SST, respectively. The gate electrodes of the gate electrode stack 130 may extend to form the word lines WL1 to WLn, the string select line SSL and the ground select line GSL, and the word lines WL1 to WLn may commonly be connected to one another in predetermined groups of memory cell strings adjacent to each other and arranged in X and Y directions.

In example embodiments, the number of the gate electrodes of the gate electrode stack 130 constituting the memory cells MC1 to MCn may be determined according to a capacity of the semiconductor device 100. According to an example embodiment, the gate electrodes of the gate electrode stack 130 of the string select transistor SST and the ground select transistor GST may be one or two or more gate electrodes, respectively, and may have a structure the same as or different from that of the gate electrodes of the gate electrode stack 130 of the memory cells MC1 to MCn. A portion of the gate electrode stack 130, for example, gate electrodes of the electrode stack 130 adjacent to the ground select transistor GST or the string select transistor SST, may be dummy gate electrodes. The dummy gate electrodes (gate electrodes of the gate electrode stack 130 adjacent to the ground select transistor GST or the string select transistor SST) may not be connected or configured to receive a normal gate voltage that would be applied to the other gate electrodes of the gate electrode stack 130 that are not adjacent to the ground select transistor GST or the string select transistor SST. For example, the dummy gate electrodes may receive a different voltage level, or may receive a voltage at a different time from when a voltage is applied to the other gate electrodes of the gate electrode stack 130 that are not adjacent to the ground select transistor GST or the string select transistor SST.

Each of the gate electrodes of the gate electrode stack 130 may include a metal, for example, tungsten (W). According to an example embodiment, each of the gate electrodes of the gate electrode stack 130 may include polycrystalline silicon or a metal silicide material. According to example embodiments, each of the gate electrodes of the gate electrode stack 130 may further include a diffusion barrier layer, and for example, the diffusion barrier may include tungsten nitride (WN), tantalum nitride (TaN), titanium nitride (TiN), or combinations thereof.

The channels CH having a columnar shape may have an inclined side of which a width is reduced toward the substrate 101 depending on an aspect ratio. The channel region 140 may be disposed in the channels CH. The channel region 140 in the channels CH may have an annular shape surrounding a channel insulating layer 150 provided therein, but may also have a columnar shape, such as a cylindrical or prismatic shape, without the channel insulating layer 150 therein, according to an example embodiment. The channel region 140 may be connected to the epitaxial layer 105 provided therebelow. The channel region 140 may include a semiconductor material such as polycrystalline silicon or singlecrystalline silicon. The semiconductor material may be an undoped material or may be a material including p-type or n-type impurities. The channels CH linearly disposed in a Y direction may be connected to different bit lines BL (see FIGS. 1 and 2) according to arrangement of an upper wiring structure connected to the channel pad 155. Further, portions of the channels CH may be dummy channels not connected to the bit lines.

The channel pads 155 may be disposed on the channel regions 140 in the channels CH. The channel pads 155 may be disposed to cover upper surfaces of the channel insulating layers 150 and to be electrically connected to the channel regions 140. The channel pads 155 may include, for example, doped polycrystalline silicon.

The gate dielectric layer 145 may be disposed between the gate electrodes of the gate electrode stack 130 and the channel region 140. The gate dielectric layer 145 may include a tunneling layer 142, a charge storage layer 143, and a blocking layer 144 sequentially stacked from the channel region 140. The tunneling layer 142 may allow for tunneling of a charge (e.g., electrons) to be transmitted to the charge storage layer 143 via Fowler-Nordheim (F-N) tunneling mechanism (a mechanism by which electrons tunnel through a barrier in the presence of a high electric field).

The tunneling layer 142 may include, for example, silicon dioxide ($SiO_2$), silicon nitride ($Si_3N_4$), silicon oxynitride (SiON), or combinations thereof. The charge storage layer 143 may be a charge trapping layer or a floating gate conductive layer. In example embodiments, when the charge storage layer 143 is a charge trapping layer, the charge storage layer 143 may be comprised of silicon nitride. The blocking layer 144 may include silicon dioxide ($SiO_2$), silicon nitride ($Si_3N_4$), silicon oxynitride (SiON), a high-k dielectric material, or combinations thereof.

The epitaxial layer 105 may be disposed on lower ends of the channels CH while being disposed on the substrate 101 and being disposed on a side of at least one gate electrode 130. The epitaxial layer 105 may be disposed in a recessed region of the substrate 101. An upper surface of the epitaxial layer 105 may be higher than an upper surface of a lowermost gate electrode 131 and may be lower than a lower surface of a gate electrode 132 provided above the lowermost gate electrode 131, but is not limited thereto. Thus, even when an aspect ratio of the channel region 140 is increased, the channel region 140 may be stably electrically connected to the substrate 101 by the epitaxial layer 105, and characteristics of the ground select transistor GST between memory cell strings may be uniform. According to example embodiments, the epitaxial layer 105 may also be omitted, and in this case, the channel region 140 may be directly connected to the substrate 101.

As illustrated in FIG. 4A, the auxiliary isolation region DMS may include a conductive layer 110 and an insulating layer 107, in a manner similar to the first and second isolation regions MS1 and MS2, while in a manner different from the first and second isolation regions MS1 and MS2, e.g., a lower portion of the conductive layer 110 of the auxiliary isolation region DMS may not be connected to the substrate 101. The conductive layer 110 in the auxiliary isolation region DMS may be spaced apart from the substrate 101 by the insulating layer 107, and may also be electrically insulated from the substrate 101. Thus, thicknesses of the conductive layers 110 may be different from each other between the first and second isolation regions MS1 and MS2 and the auxiliary isolation region DMS. For example, a thickness of each of the conductive layers 110 in the first and second isolation regions MS1 and MS2 may be greater than that of the conductive layer 110 in the auxiliary isolation region DMS.

The structural difference as described above may be provided since the width W2 of the auxiliary isolation region DMS in a Y direction is narrower than the width W1 of each of the first and second isolation regions MS1 and MS2 in the Y direction such that an insulating material may not be completely removed from an upper surface of the substrate 101 when the insulating layer 107 is formed. Alternatively, since the auxiliary isolation region DMS extends to have a length shorter than a length of each of the first and second isolation regions MS1 and MS2 in an X direction, regions close to both edges thereof may have such a structure. Due to the difference in widths of the first and second isolation regions MS1 and MS2 and the auxiliary isolation region DMS, the conductive layers 110 therein may also have different widths. According to example embodiments, the width of the conductive layers 110 of the auxiliary isolation region DMS in a Y direction is narrower than the width of conductive layers 110 of each of the first and second isolation regions MS1 and MS2 in the Y direction As illustrated in FIG. 4B, a total of three gate electrodes of the gate electrode stack 130, including an uppermost gate electrode 138, may be divided into several regions in the Y direction by the string insulating layer 103, but the number of the gate electrodes of the gate electrode stack 130 divided by the string insulating layer 103 is not limited thereto.

Figure 4C:
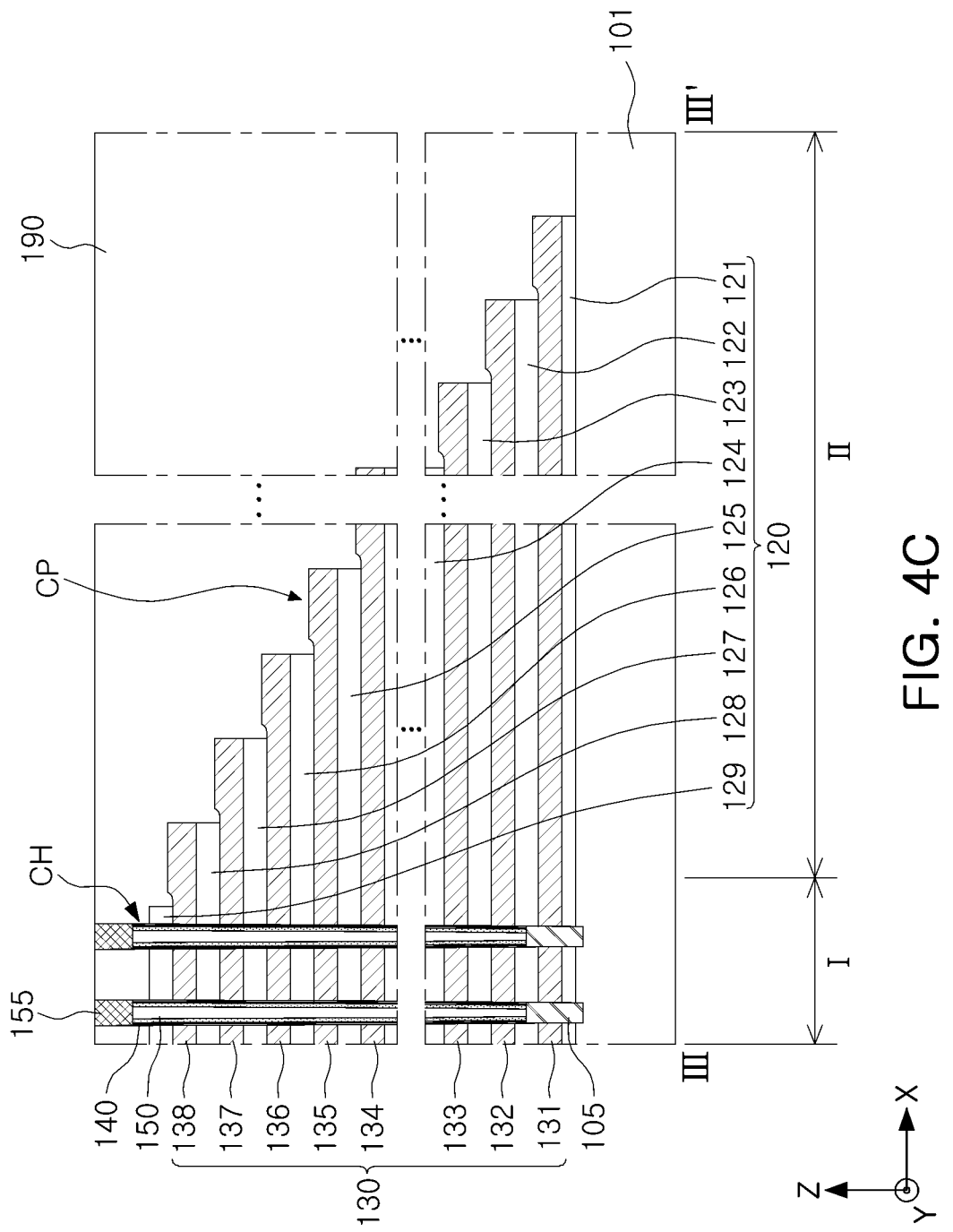
Figure 4D:
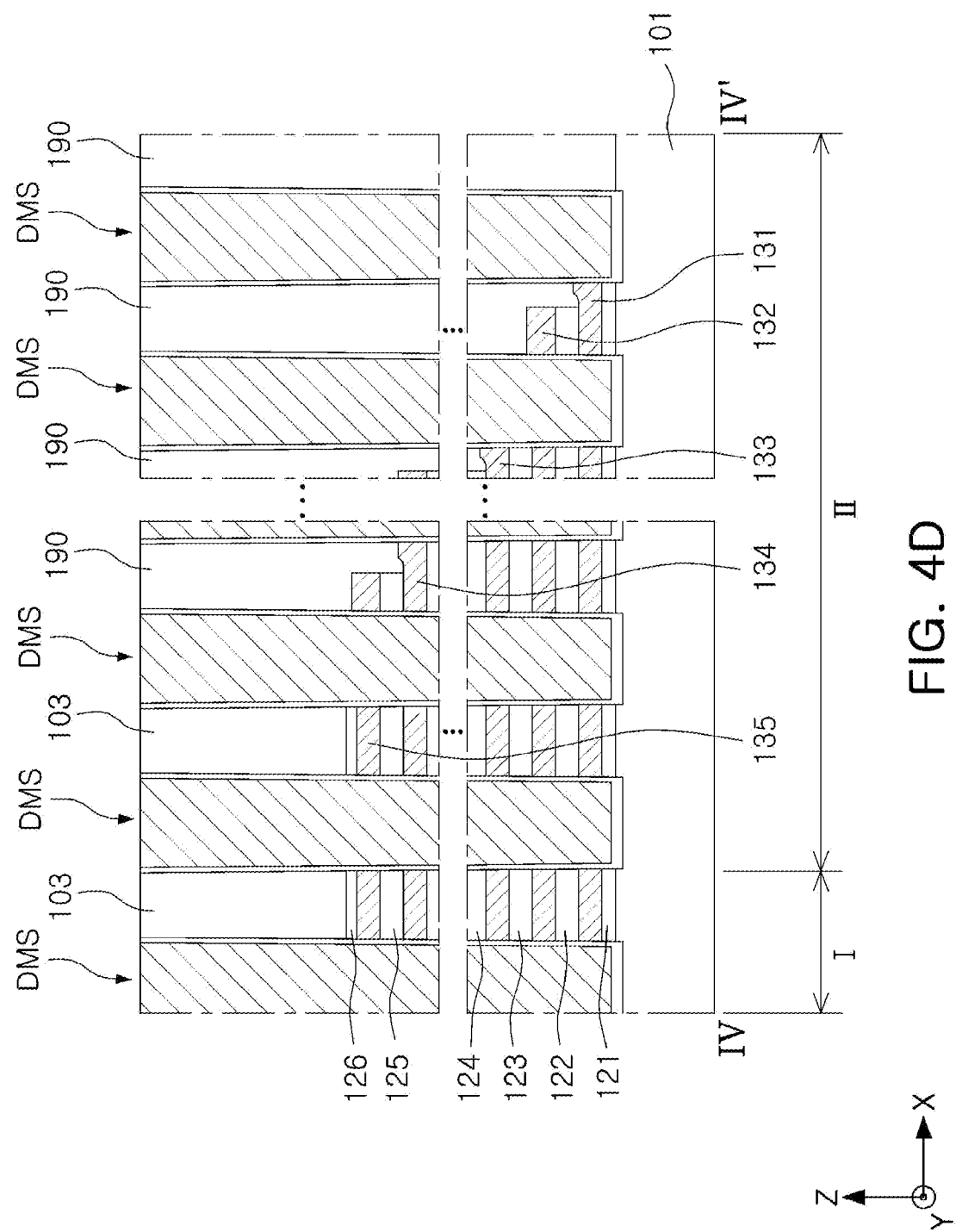

With reference to FIGS. 4C and 4D, in the second region II of the substrate 101, each of the gate electrodes of the gate electrode stack 130 may extend to have different lengths in the X direction to form contact regions CP having a stepped shape. For example, a lower gate electrode of the gate electrode stack 130 extends to be longer in the X direction than an upper gate electrode of the gate electrode stack 130. In the contact regions CP, each of the gate electrodes of the gate electrode stack 130 may be connected to contact plugs, by which the gate electrode stack 130 are connected to an upper wiring structure. As illustrated in FIG. 4C, in the contact regions CP, each of the gate electrodes of the gate electrode stack 130 may have an increased thickness in a Y direction to be stably connected to the contact plugs. Contact plugs may be, for example, conductive plugs formed of a conductive material such as a metal.

As illustrated in FIG. 4D, the auxiliary isolation regions DMS may be alternately disposed with the string isolation regions SS in the X direction in the first region I and portions of the second region II. The auxiliary isolation regions DMS may penetrate through all of layers of the gate electrode stack 130 to be connected to the substrate 101 in the first region I, and in the second region II, may be disposed to penetrate through a peripheral-region insulating layer 190 and a portion of the gate electrode stack 130 stacked on the substrate 101.

Figure 5:
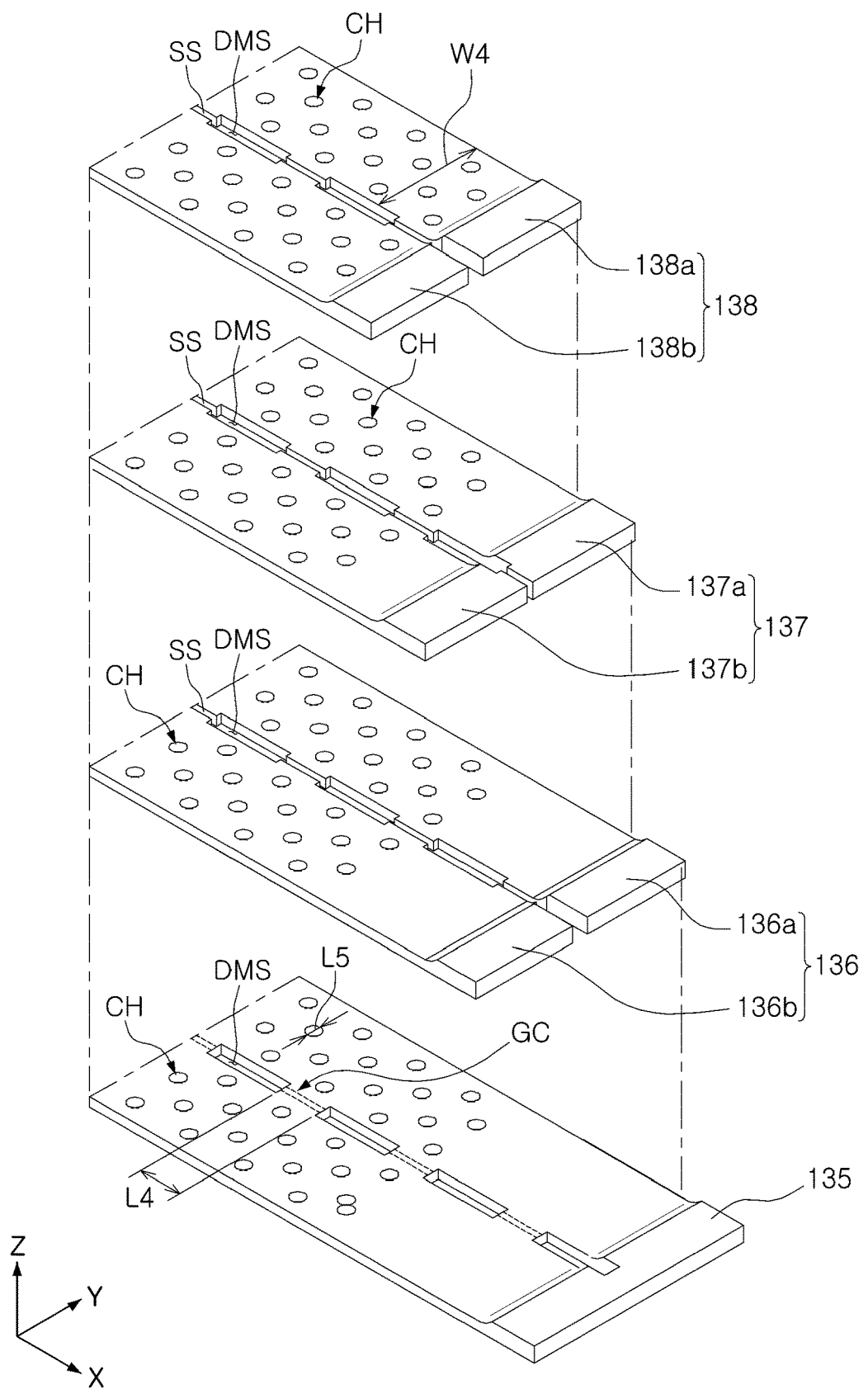
FIG. 5 is an exploded perspective diagram illustrating gate electrodes of a semiconductor device according to example embodiments.

FIG. 5 is an exploded perspective diagram illustrating gate electrodes of a semiconductor device according to example embodiments.

Referring to FIG. 5, a portion of the gate electrode stack 130 disposed between the first and second isolation regions MS1 and MS2 of FIG. 3 is illustrated. Among the gate electrodes of the gate electrode stack 130, upper gate electrodes 137 and 138, used as the string select line SSL, and a dummy gate electrode 136 may be respectively divided into two subgate electrodes 136a and 136b, 137a and 137b, and 138a and 138b in the Y direction, respectively, by the string isolation regions SS and the auxiliary isolation regions DMS. Each of the subgate electrodes 136a, 136b, 137a, 137b, 138a and 138b may be connected to a contact plug to receive an electrical signal independently. The subgate electrodes 136a and 136b, 137a and 137b, and 138a and 138b may have a repetitive bend or step on side surfaces thereof opposing each other. Such a bend or step may be formed by a difference in widths between the string isolation regions SS and the auxiliary isolation regions DMS in the Y direction. In example embodiments, the subgate electrodes 136a, 136b, 137a, 137b, 138a and 138b may also be extended to have a uniform width without a step on the opposing side surfaces.

The other gate electrodes, e.g., the lower gate electrodes of the gate electrode stack 130 below the dummy gate electrode 136 may not be separated by the string isolation regions SS, to have a single connected form, such as a gate electrode 135 illustrated in FIG. 5. In detail, the gate electrode 135 may be disposed as a single gate electrode in a form connected by gate connection portions GC below the string isolation regions SS. Thus, the gate connection portions GC may connect lower gate electrodes of the gate electrode stack 130 to each other, to be provided as a single gate electrode between the first and second isolation regions MS1 and MS2, and thus, may serve as a support preventing the occurrence of leaning in a stacked structure of the gate electrode stack 130.

A length L4 of each of the gate connection portions GC in the X direction may be less than a distance equal to twice a minimum width W4 of each of the subgate electrodes 136a, 136b, 137a, 137b, 138a and 138b in the Y direction. For example, as described above, while filling of a material forming the gate electrode stack 130 between the first and second isolation regions MS1 and MS2 is completed, the filling of the material between the auxiliary isolation regions DMS may also be sufficiently completed. In addition, the length L4 may be greater than a width or a diameter L5 of the channel CH.

Figure 6:
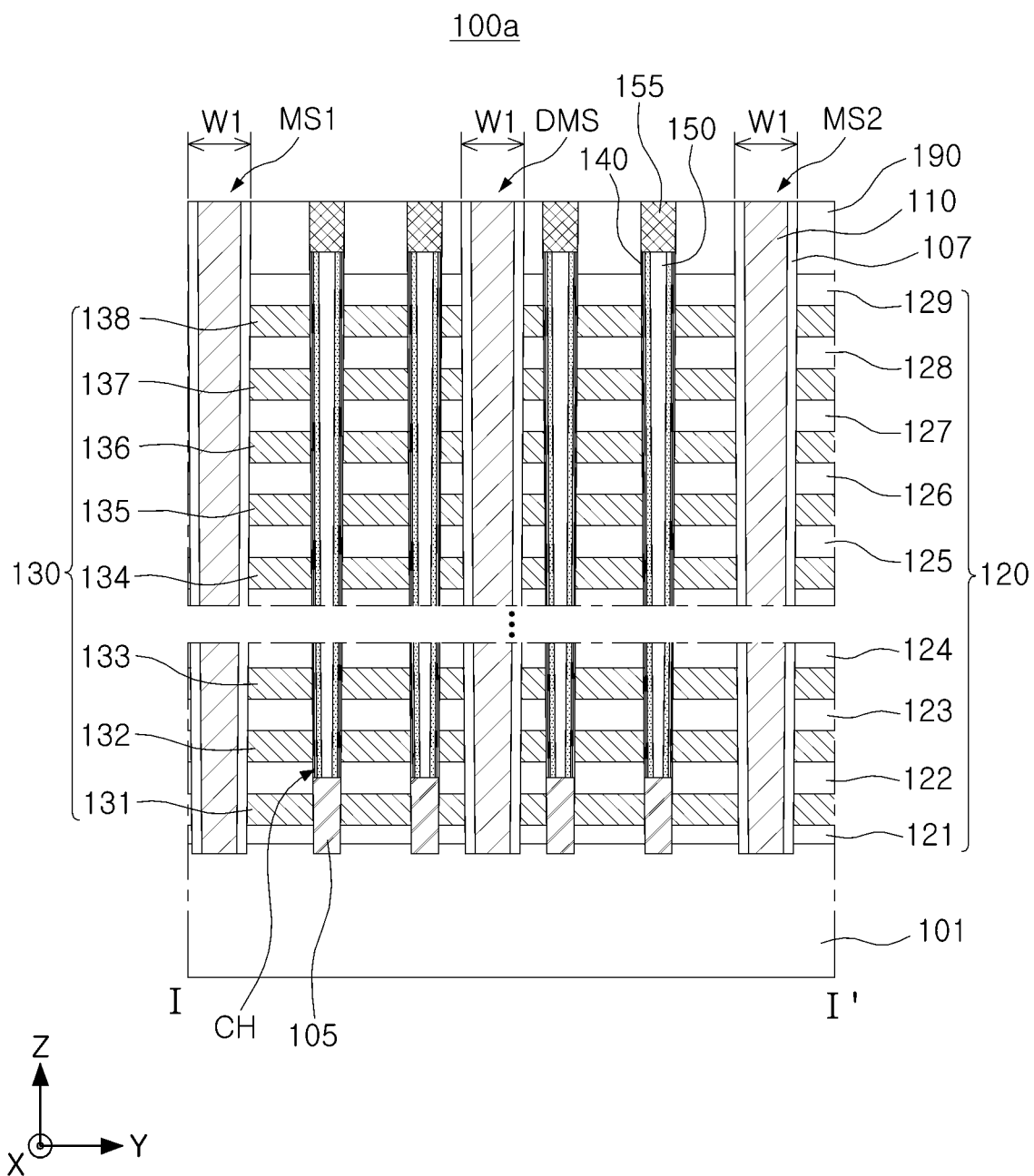
FIG. 6 is a schematic cross-sectional view of a semiconductor device according to example embodiments.

FIG. 6 is a schematic cross-sectional view of a semiconductor device according to example embodiments. FIG. 6 illustrates a region corresponding to a cross section region taken along line I-I' in the plan view of FIG. 3.

Referring to FIG. 6, a structure of an auxiliary isolation region DMS of a semiconductor device 100a may differ from that in the example embodiment of the semiconductor device 100 illustrated in FIG. 4A. In an example embodiment of FIG. 6, the auxiliary isolation region DMS may have substantially the same structure as the first and second isolation regions MS1 and MS2. The auxiliary isolation region DMS may have the same width W1 as that of each of the first and second isolation regions MS1 and MS2 in the Y direction, and thus, may have the same structure. A lower portion of a conductive layer 110 of the auxiliary isolation region DMS may be connected to a substrate 101 in a manner similar to that of conductive layers 110 of first and second isolation regions MS1 and MS2. In this exemplary embodiment, the conductive layer 110 of the auxiliary isolation region DMS may not be connected to other wiring structures, and may not have an electrical signal applied thereto, in a manner different from the conductive layers 110 of the first and second isolation regions MS1 and MS2. Alternatively, according to example embodiments, an electrical signal may be applied to the conductive layer 110 of the auxiliary isolation region DMS, and the electrical signal may be the same as or different from that of the conductive layers 110 of the first and second isolation regions MS1 and MS2.

Figure 7A:
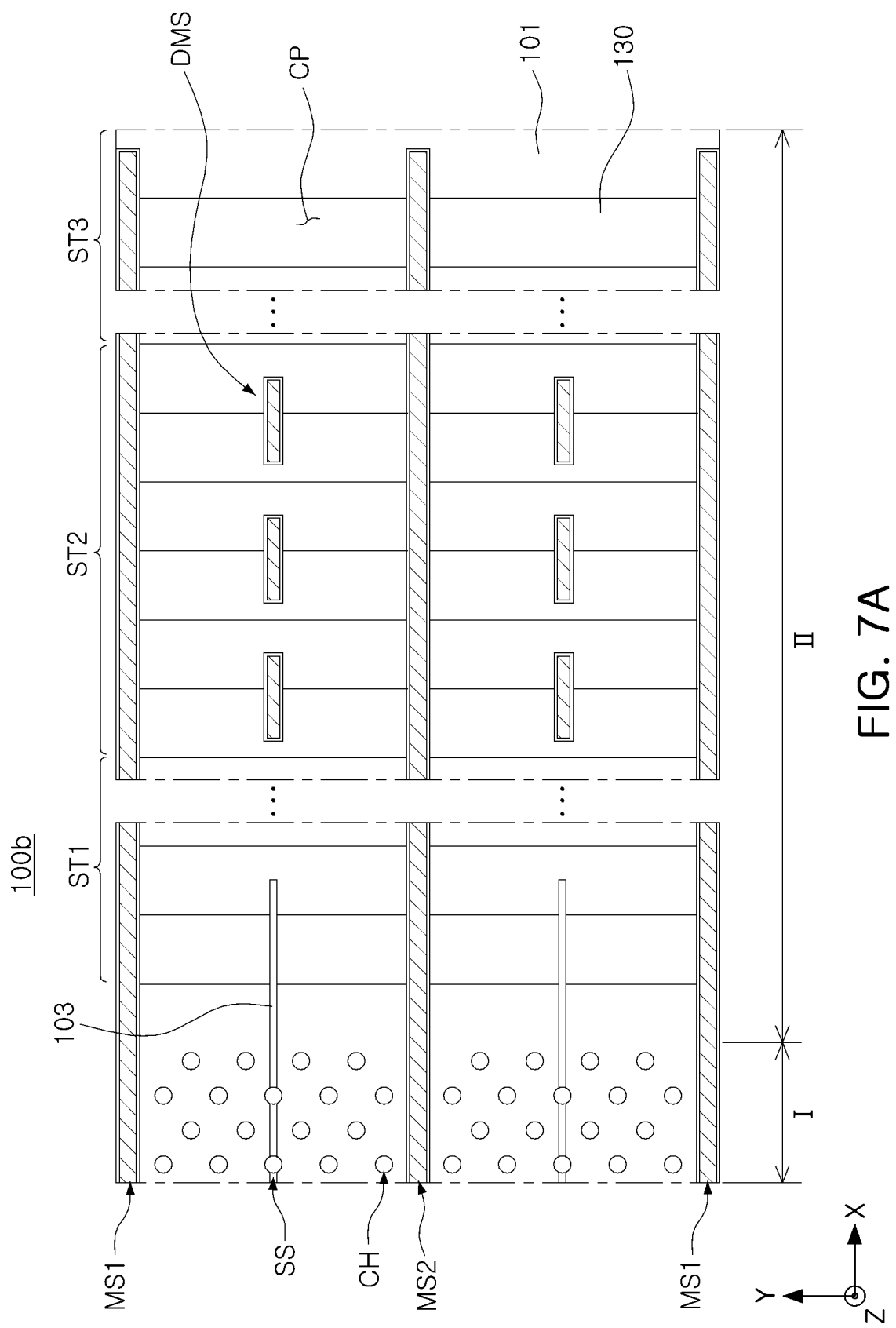
FIGS. 7A and 7B are schematic plan views of semiconductor devices according to example embodiments.
Figure 7B:
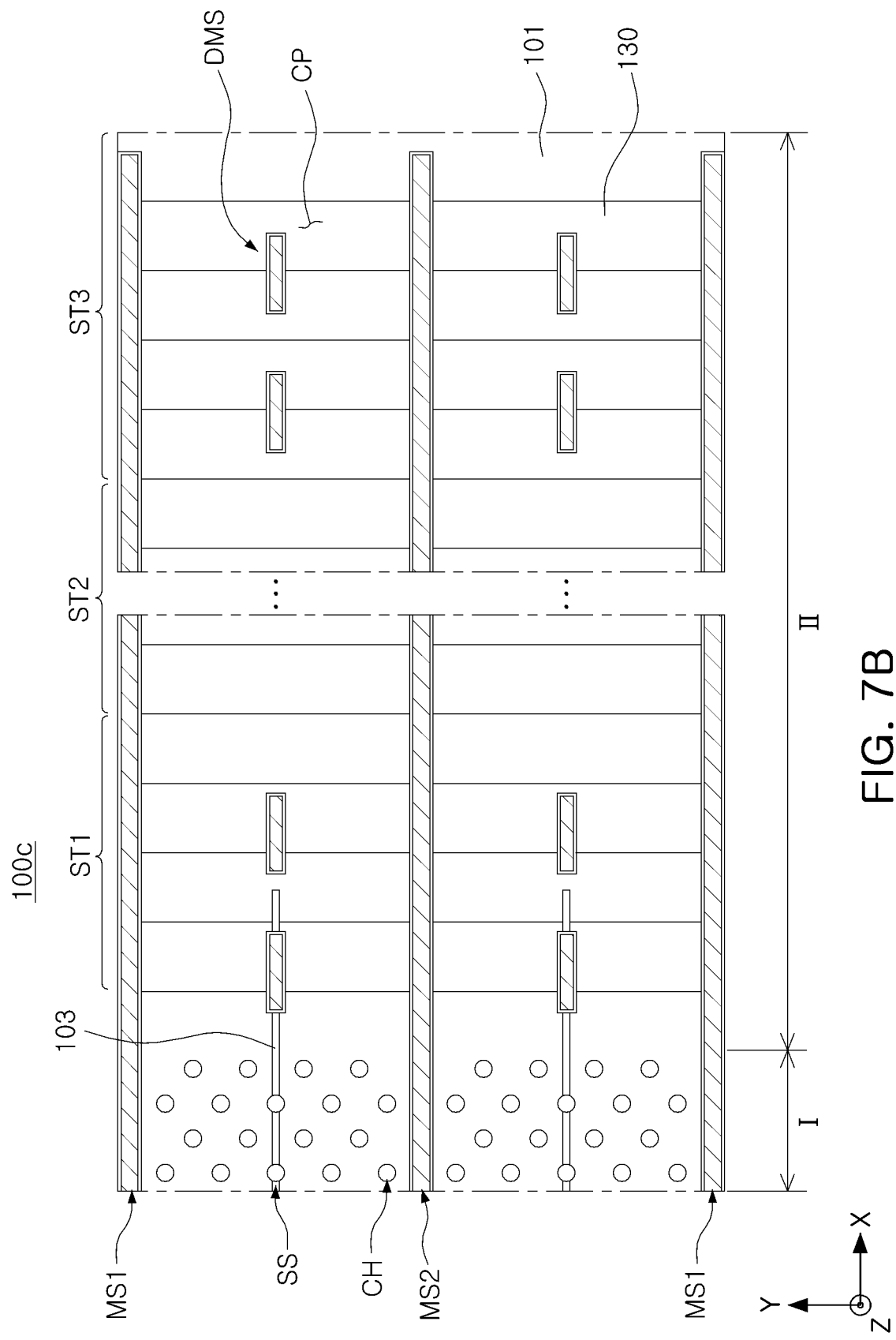

FIGS. 7A and 7B are schematic plan views of semiconductor devices according to example embodiments.

With reference to FIGS. 7A and 7B, semiconductor devices 100b and 100c may be different from the semiconductor device 100 according to the example embodiment of FIG. 3 in that arrangement of auxiliary isolation regions DMS is different from that in the semiconductor device 100 illustrated in FIG. 3. In example embodiments of FIGS. 7A and 7B, the auxiliary isolation regions DMS may only be disposed in portions of a second region II.

The second region II may include first to third pad regions ST1, ST2 and ST3 sequentially disposed from the first region I. In the case of gate electrode stack 130 in the second region II, since a lower gate electrode of the gate electrode stack 130 extends to be longer than an upper gate electrode of the gate electrode stack 130 to provide contact regions CP, the number of the gate electrodes of the gate electrode stack 130 stacked on a substrate 101 may be reduced in a direction from the first pad region ST1 to the third pad region ST3.

In the example embodiment of FIG. 7A, the auxiliary isolation regions DMS may only be disposed in the second pad region ST2 of the second region II. For example, when the volume of the gate electrode stack 130 is relatively larger in the second region II than in the first region I due to a density of channels CH or the like, the auxiliary isolation regions DMS may only be disposed in the second pad region ST2, except for the first pad region ST1 adjacent to the first region I and the third pad region ST3 in which the number of the gate electrodes of the gate electrode stack 130 is relatively small. Thus, the gate electrode stack 130 may be easily formed.

The second pad region ST2 may be a region including a contact region CP, of a gate electrode 130, located centrally in a direction perpendicular to an upper surface of the substrate 101, among the gate electrodes of the gate electrode stack 130. For example, when the total number of gate electrodes of the gate electrode stack 130 is N, and thus, N number of contact regions CP are disposed, 0.2N number to 0.3N number of contact regions CP may be disposed in the first and third pad regions ST1 and ST3, respectively, and 0.4N number to 0.6N number of contact regions CP may be disposed in the second pad region ST2. The numbers of the contact regions CP included in the first pad region ST1 and the third pad region ST3 may be different from each other. In the second pad region ST2, the auxiliary isolation regions DMS may be disposed linearly with the string isolation region SS, and may be arranged to have a predetermined spacing distance therebetween.

In the example embodiment of FIG. 7B, the auxiliary isolation regions DMS may only be disposed in the first and third pad regions ST1 and ST3. For example, in the case in which the second pad region ST2 is relatively vulnerable to inclination, the auxiliary isolation regions DMS may only be disposed in the first pad region ST1 adjacent to the first region I and in the third pad region ST3 in which the number of the gate electrodes of the gate electrode stack 130 is relatively small. A region in which the auxiliary isolation regions DMS are disposed may be differently selected according to example embodiments, in consideration of the volume of the gate electrode stack 130, an aspect ratio of a stacked structure of the gate electrode stack 130, processes applied thereto, and the like. In example embodiments, the auxiliary isolation regions DMS may be arranged to have different distances therebetween in the X direction in the first to third pad regions ST1, ST2 and ST3.

According to example embodiments, the auxiliary isolation regions DMS may also be disposed in the first region I as in the example embodiment of FIG. 3, and in the case of the second region II, may only be disposed in the second pad region ST2 in the same manner as the example embodiment of FIG. 7A. Further, in example embodiments, the auxiliary isolation regions DMS may be arranged to have different densities in the first region I and the second region II. For example, the auxiliary isolation regions DMS may be arranged at a higher density in the second region II than in the first region I, and may also be arranged at different densities within the first region I and the second region II.

FIGS. 8A to 12B are schematic plan views and cross-sectional views illustrating a method of manufacturing a semiconductor device according to example embodiments.

Figure 8A:
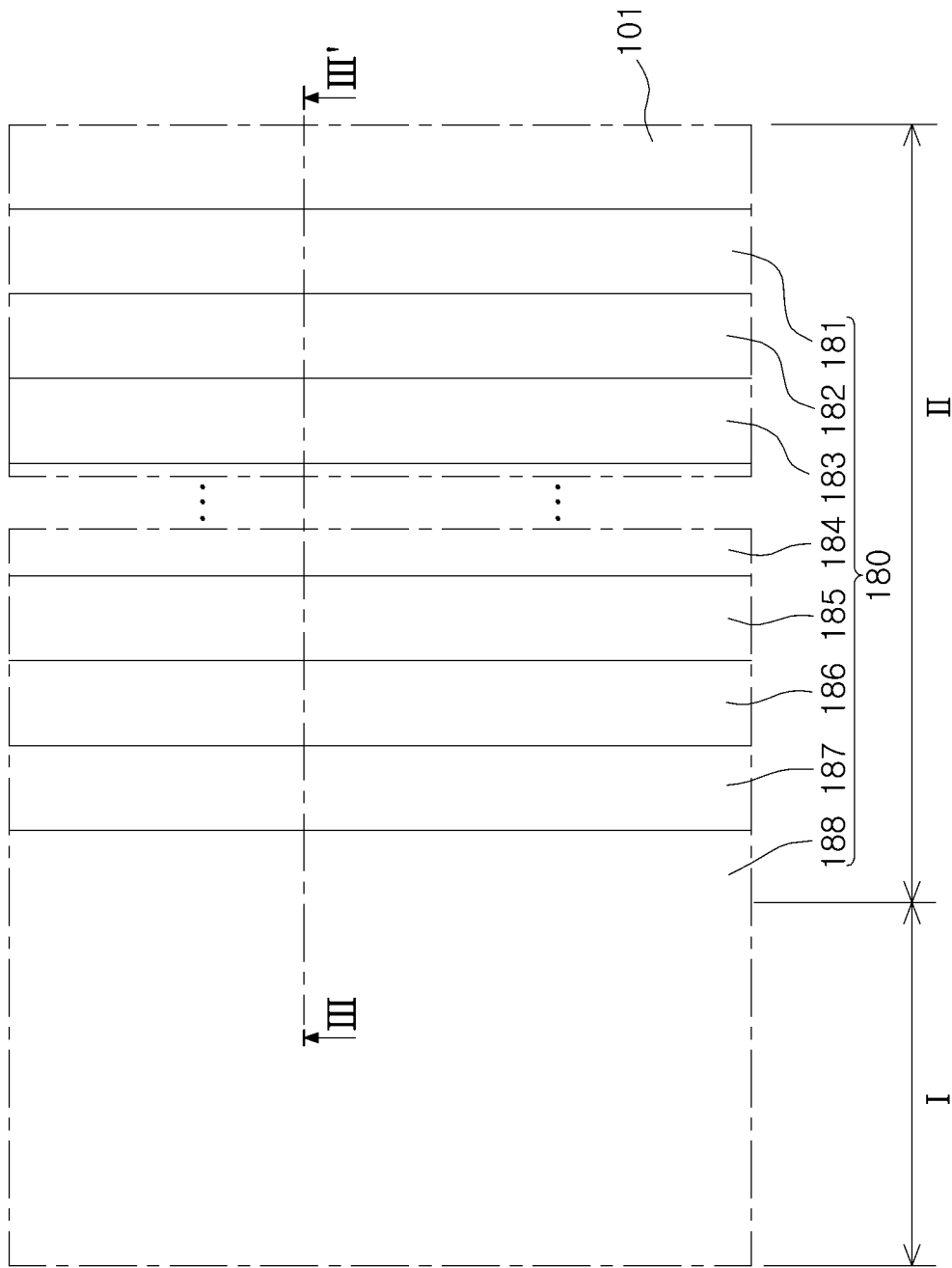
FIGS. 8A to 12B are schematic plan views and cross-sectional views illustrating a method of manufacturing a semiconductor device according to example embodiments.
Figure 8B:
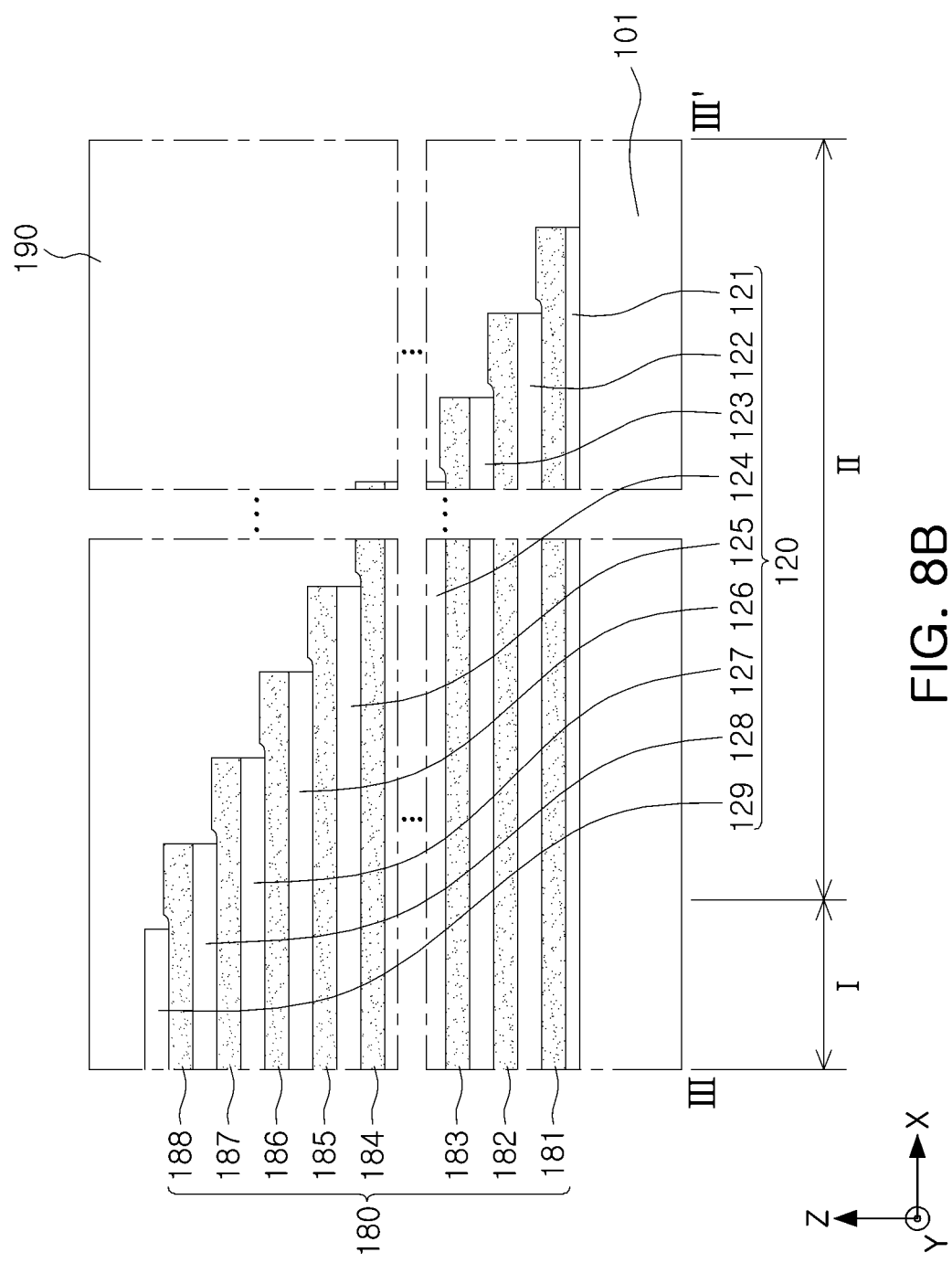

With reference to FIGS. 8A and 8B, sacrificial layers 181 to 188 (collectively, sacrificial layers 180) and interlayer insulating layers 121 to 129 (collectively, interlayer insulating layers 120) may be alternately stacked on a substrate 101, and portions of the sacrificial layers 180 and the interlayer insulating layers 120 may be removed in such a manner that the sacrificial layers 180 extend to have different lengths in an X direction.

The sacrificial layers 180 may be layers replaced with gate electrodes of the gate electrode stack 130 in a subsequent process. The sacrificial layers 180 may be formed of a material that may be etched with etch selectivity with respect to the interlayer insulating layers 120. For example, the interlayer insulating layers 120 may be formed of at least one of a silicon oxide and a silicon nitride, and the sacrificial layers 180 may be formed of a material composition selected from silicon, silicon oxide, silicon carbide, and silicon nitride, and that is different from a material composition of the interlayer insulating layers 120. In example embodiments, thicknesses of the interlayer insulating layers 120 may not all be equal to each other. For example, a lowermost interlayer insulating layer 121 may be formed to have a relatively reduced thickness in a Z direction, and an uppermost interlayer insulating layer 129 may be formed to have a relatively increased thickness in the Z direction. Thicknesses of, and the number of layers constituting, the interlayer insulating layers 120 and the sacrificial layers 180, may be variously modified from those illustrated in the drawings.

A photolithography process and an etching process for the sacrificial layers 180 may be repeatedly performed such that upper sacrificial layers 180 may extend to have a shorter length in an X direction than those of lower sacrificial layers 180 in the second region II in the X direction. Thus, the sacrificial layers 180 may be formed to have a stepped shape. Subsequently, end portions of the sacrificial layers 180 may be formed to have a relatively increased thickness by further depositing a material forming the sacrificial layers 180 on regions of the sacrificial layers 180 exposed by extending to be longer in the X direction than upper sacrificial layers 180 and by etching the material deposited on sides of the interlayer insulating layers 120 in the case in which the material is deposited on the sides of the interlayer insulating layers 120. Next, a peripheral-region insulating layer 190 covering an upper portion of a stacked structure of the sacrificial layers 180 and the interlayer insulating layers 120 may be formed.

Figure 9A:
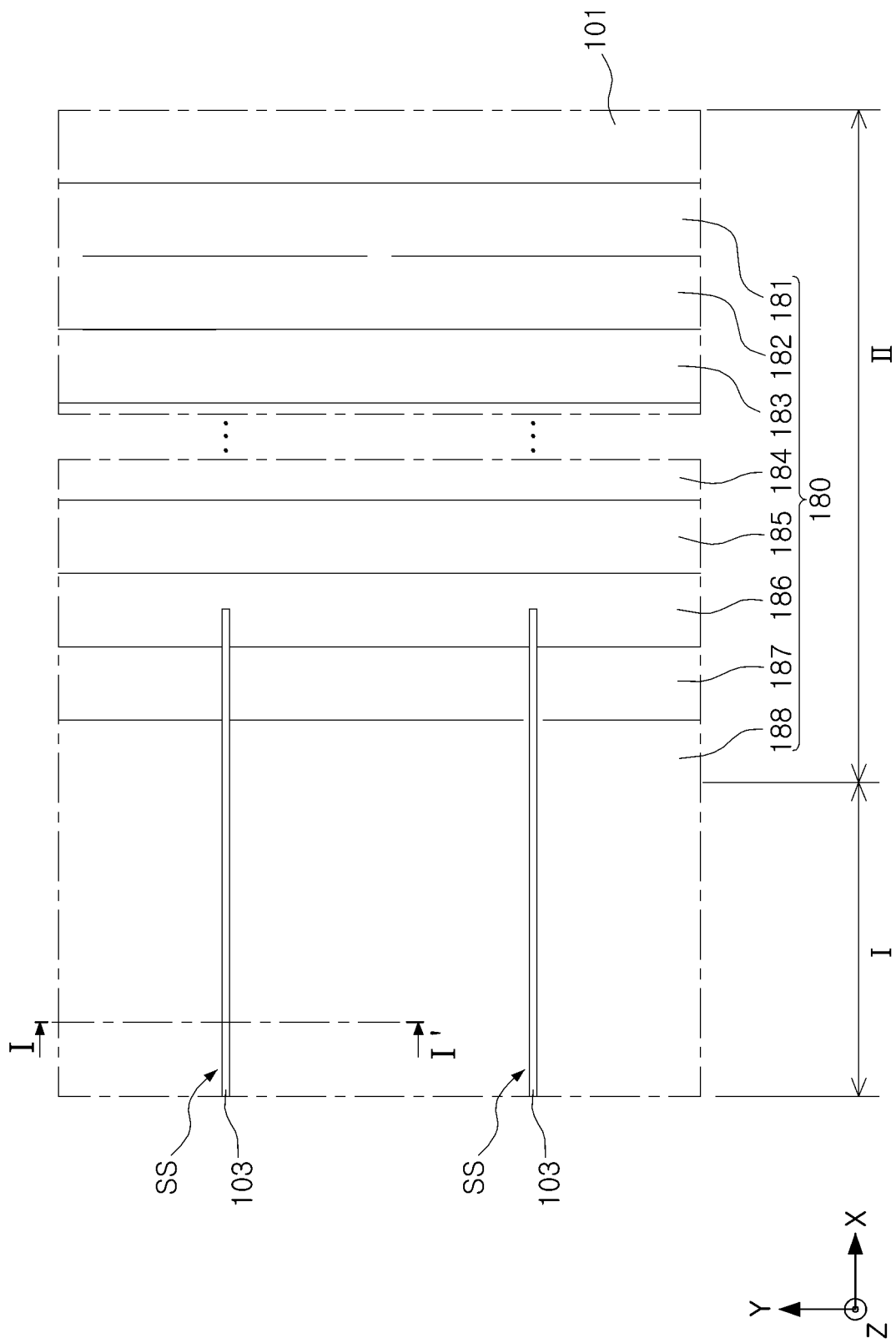
Figure 9B:
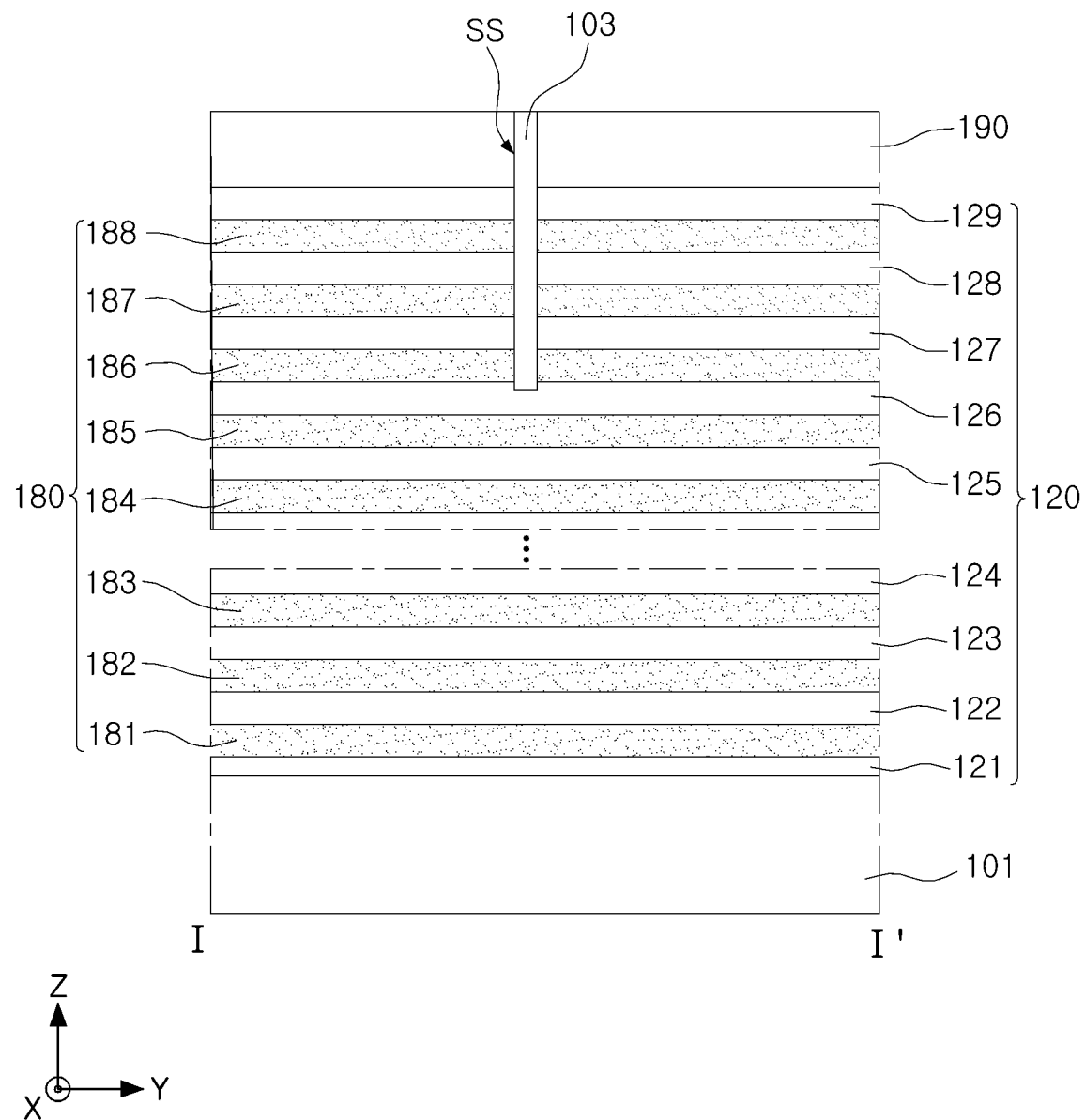

With reference to FIGS. 9A and 9B, portions of the sacrificial layers 180 and the interlayer insulating layers 120 may be removed to form a string isolation region SS.

The string isolation region SS may extend in an X direction and may extend from the first region I to at least a portion of the second region II. A separate mask layer may be used to expose a region in which the string isolation region SS is to be formed and a predetermined number of sacrificial layers 180 and interlayer insulating layers 120 may be removed from an uppermost portion. The string insulating layer 103 may be formed by depositing an insulating material in the region formed by removing the sacrificial layers 180 and the interlayer insulating layers 120. The string insulating layer 103 may be formed of a material having etch selectivity with respect to the sacrificial layers 180, and for example, may be formed of the same material as that of the interlayer insulating layer 120.

Figure 10A:
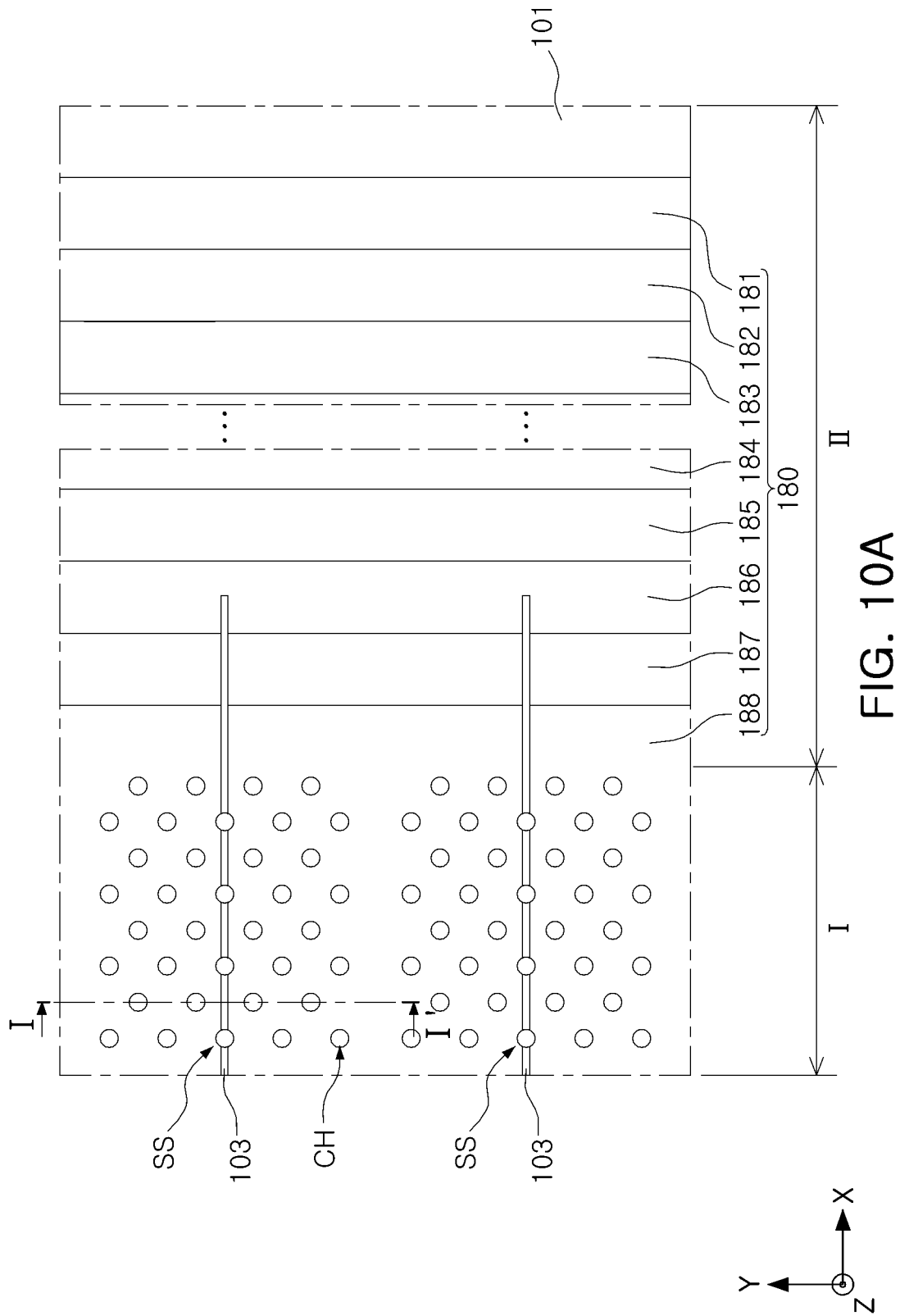
Figure 10B:
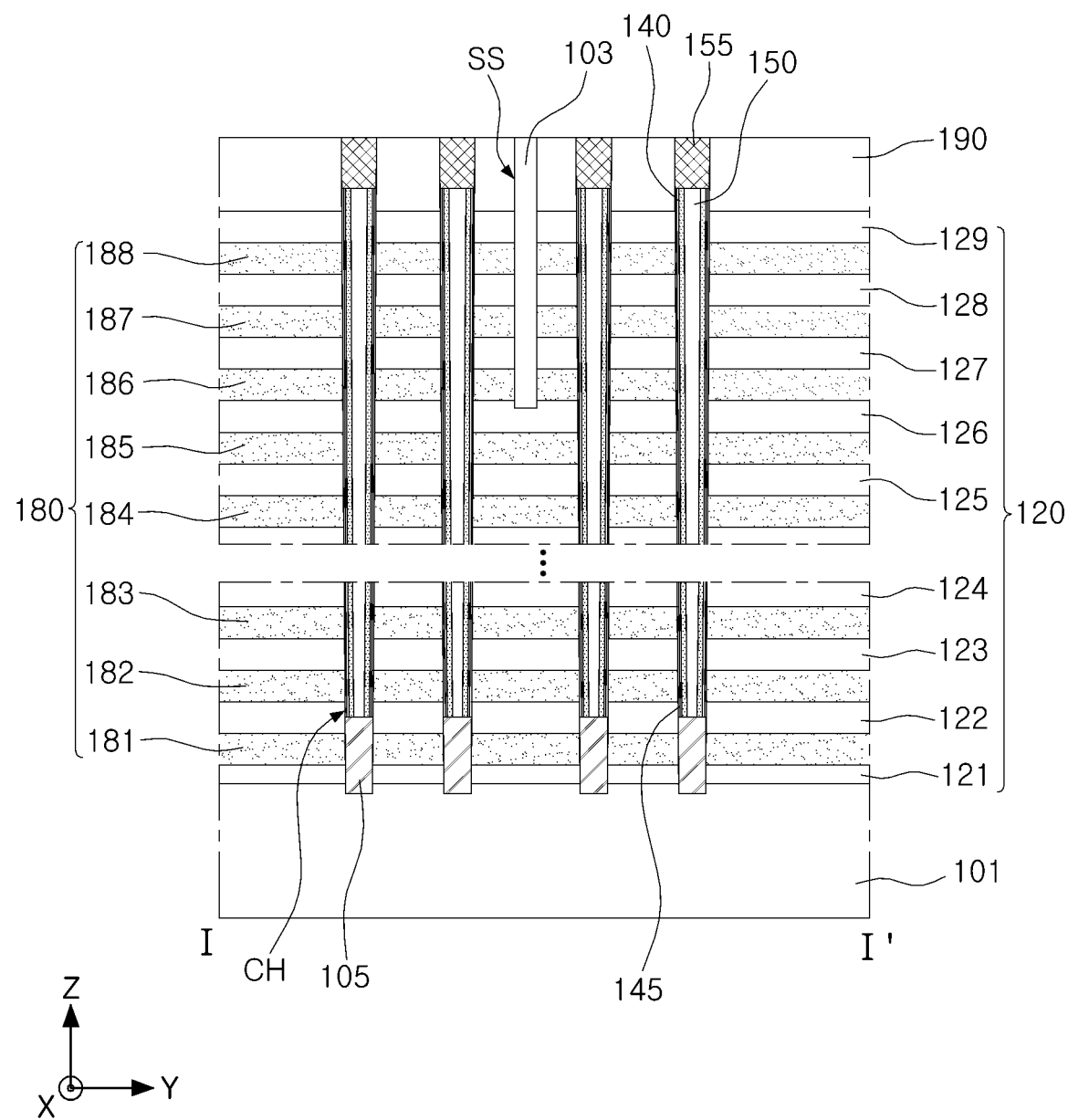

With reference to FIGS. 10A and 10B, channels CH may be formed to penetrate through a stacked structure of the sacrificial layers 180 and the interlayer insulating layers 120.

The channels CH may be formed by anisotropically etching the sacrificial layers 180 and the interlayer insulating layers 120, and may be formed in a hole shape. Due to a height of the stacked structure, sidewalls of the channels CH may not be perpendicular to an upper surface of the substrate 101. In example embodiments, the channels CH may be formed in such a manner that portions of the substrate 101 are recessed by the formation of the channels. Subsequently, an epitaxial layer 105, at least a portion of a gate dielectric layer 145, a channel region 140, a channel insulating layer 150, and a channel pad 155 may be formed in the channels CH.

The epitaxial layer 105 may be formed using a selective epitaxial growth (SEG) process. The epitaxial layer 105 may be formed of a single layer or a plurality of layers. The epitaxial layer 105 may include polycrystalline silicon, singlecrystalline silicon, polycrystalline germanium or singlecrystalline germanium, doped or undoped with impurities.

The gate dielectric layer 145 may be formed to have a uniform thickness using atomic layer deposition (ALD) or chemical vapor deposition (CVD). In this operation, a portion or the entirety of the gate dielectric layer 145 may be formed, an portions of the gate dielectric layer 145 extending perpendicularly to an upper surface of the substrate 101 along the channels CH, for example, the tunneling layer 142 and the charge storage layer 143 of FIG. 4A may be formed. The channel region 140 may be formed on the gate dielectric layer 145 in the channels CH. The channel insulating layer 150 may be formed to fill the channels CH and may be formed of an insulating material, but according to example embodiments, the channel regions 140 may be filled with a conductive material rather than the channel insulating layer 150. The channel pad 155 may be made of a conductive material, for example, polycrystalline silicon.

A portion of the channels CH may be provided as dummy channels, and dummy channels may also be formed in the second region II. For example, the channels CH formed to overlap the string isolation region SS may correspond to dummy channels.

Figure 11A:
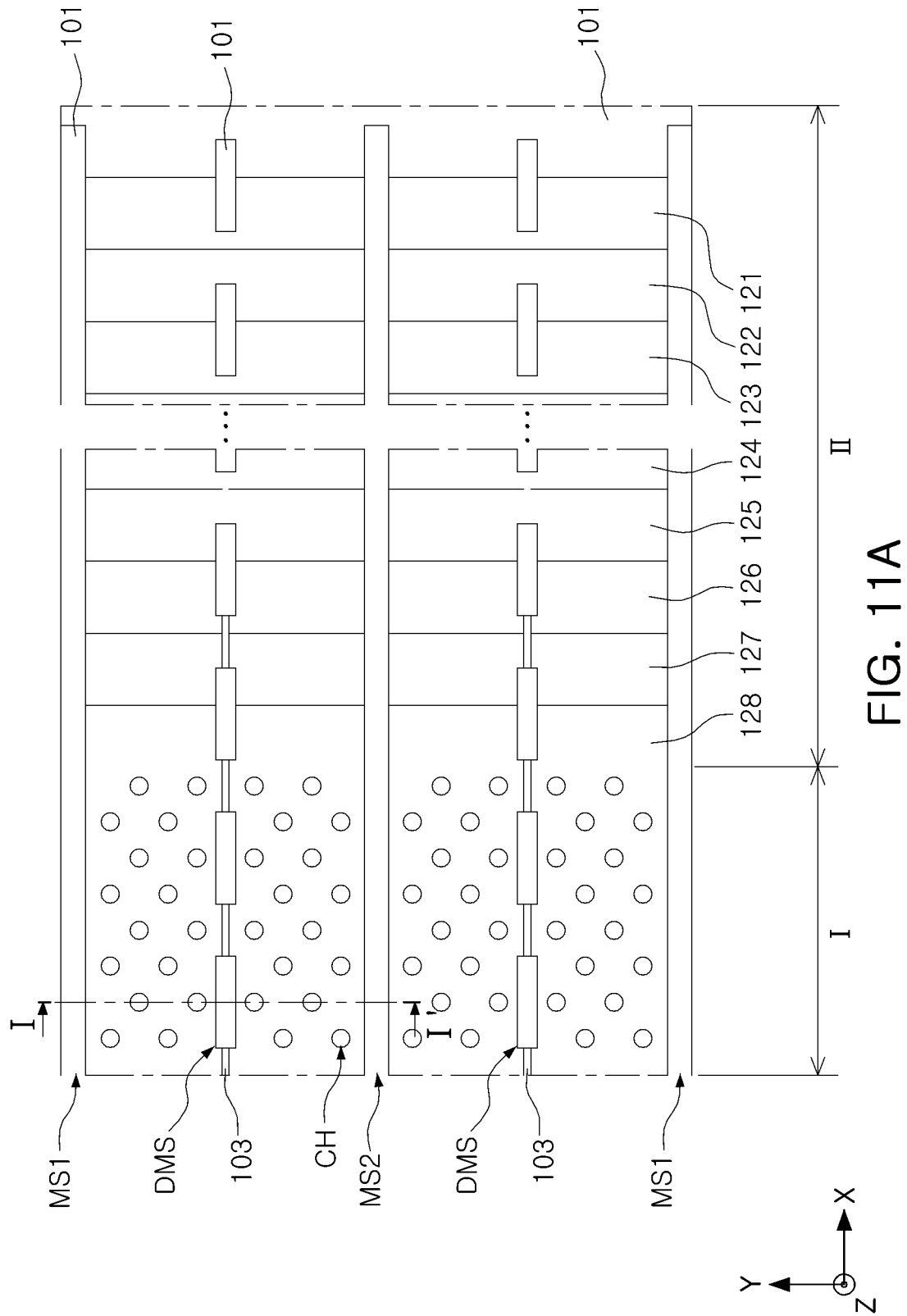
Figure 11B:
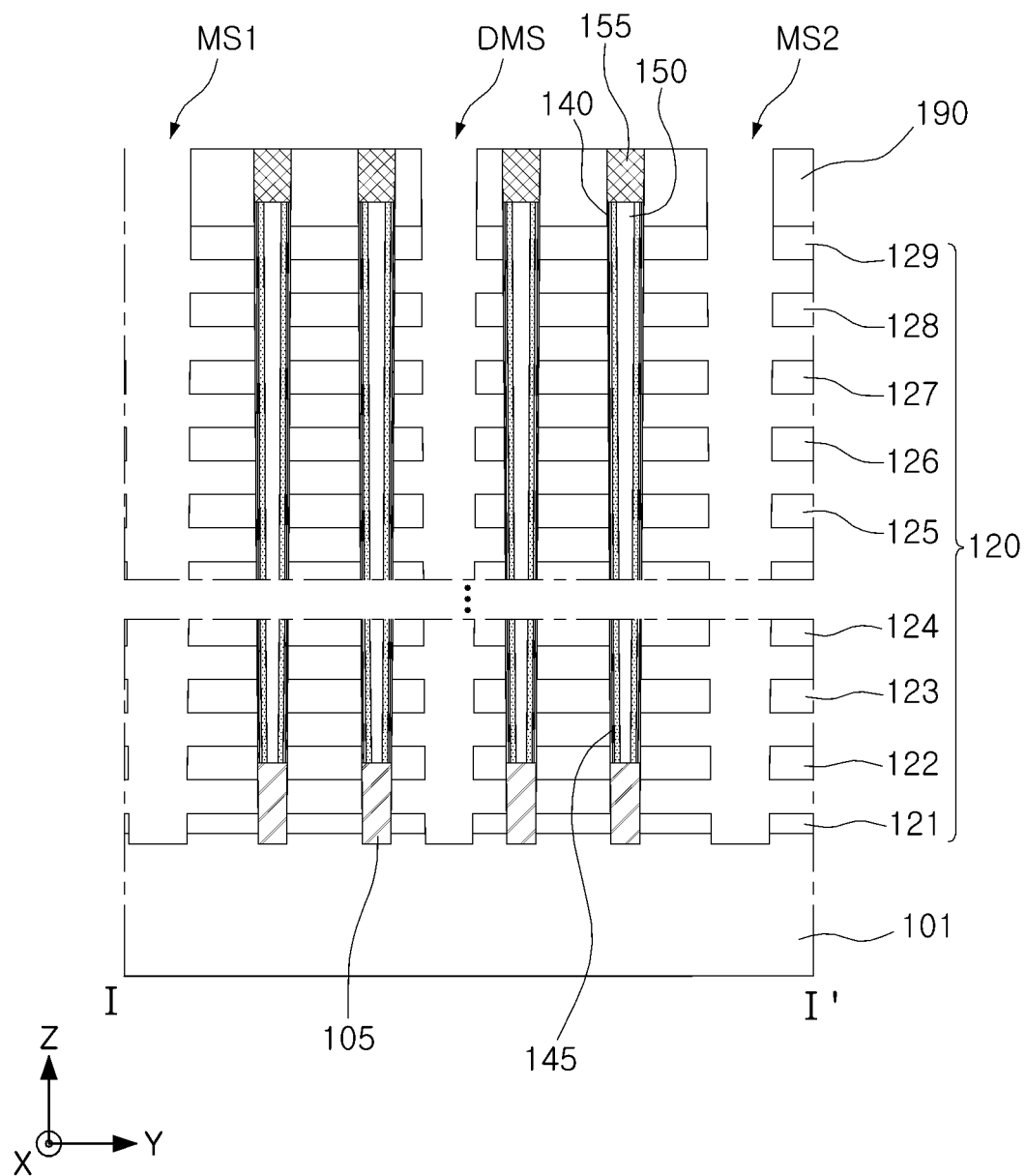

With reference to FIGS. 11A and 11B, first and second isolation regions MS1 and MS2 and auxiliary isolation regions DMS, penetrating through the stacked structure of the sacrificial layers 180 and the interlayer insulating layers 120, may be formed, and the sacrificial layers 180 exposed therethrough may be removed.

The first and second isolation regions MS1 and MS2 and the auxiliary isolation regions DMS may be formed by forming a mask layer using a photolithography process and anisotropically etching the stacked structure. The first and second isolation regions MS1 and MS2 may be formed in a trench shape extending in an X direction. The auxiliary isolation regions DMS may be formed in the shape of a rectangular or elliptical opening extending in the X direction. In this operation, the substrate 101 provided below the first and second isolation regions MS1 and MS2 and the auxiliary isolation regions DMS may be exposed therethrough.

The sacrificial layers 180 may be selectively removed with respect to the interlayer dielectric layers 120 using, for example, wet etching. A plurality of side openings may be formed between the interlayer insulating layers 120, and portions of sidewalls of the gate dielectric layers 145 in the channels CH may be exposed through the side openings.

Figure 12A:
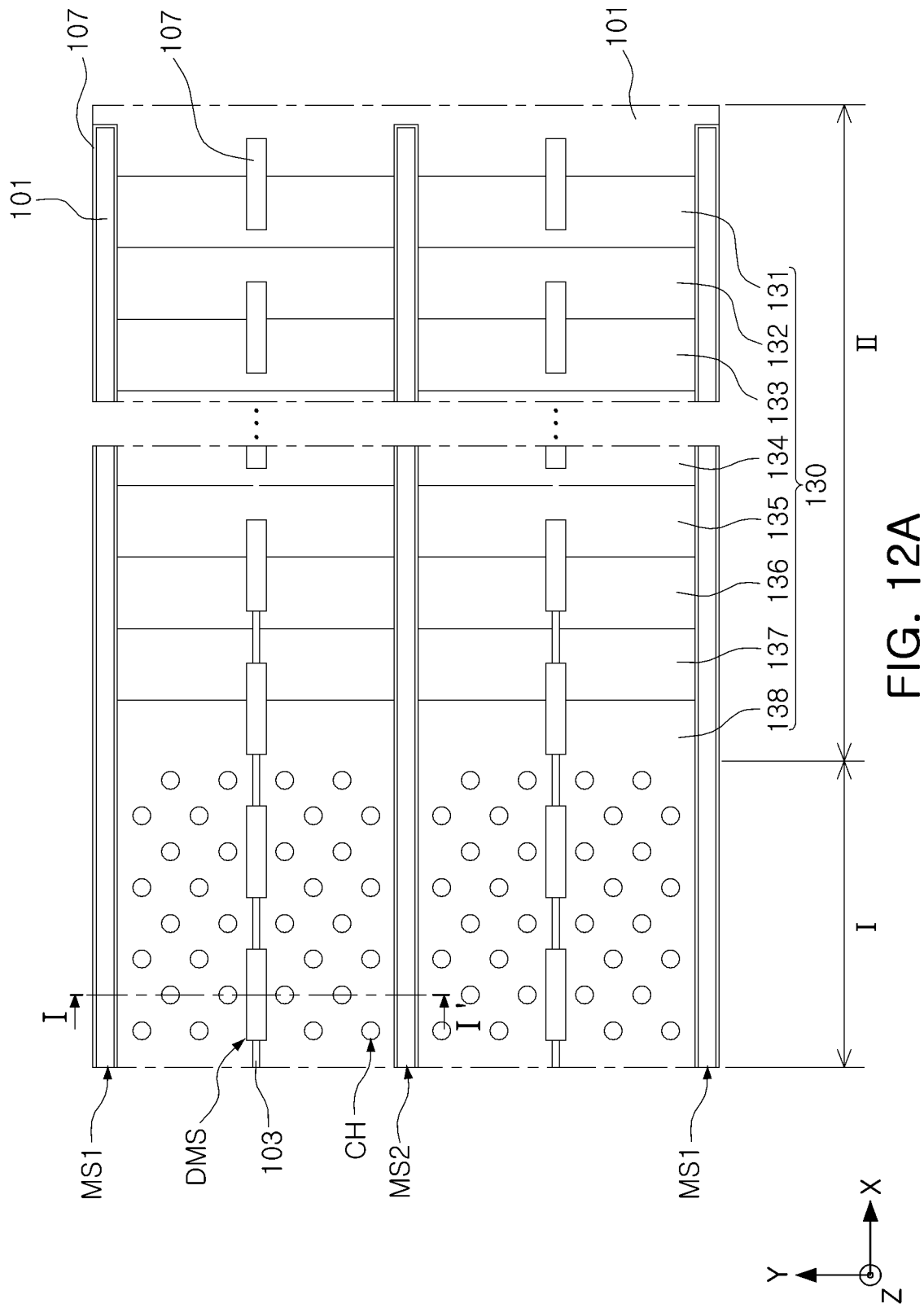
Figure 12B:
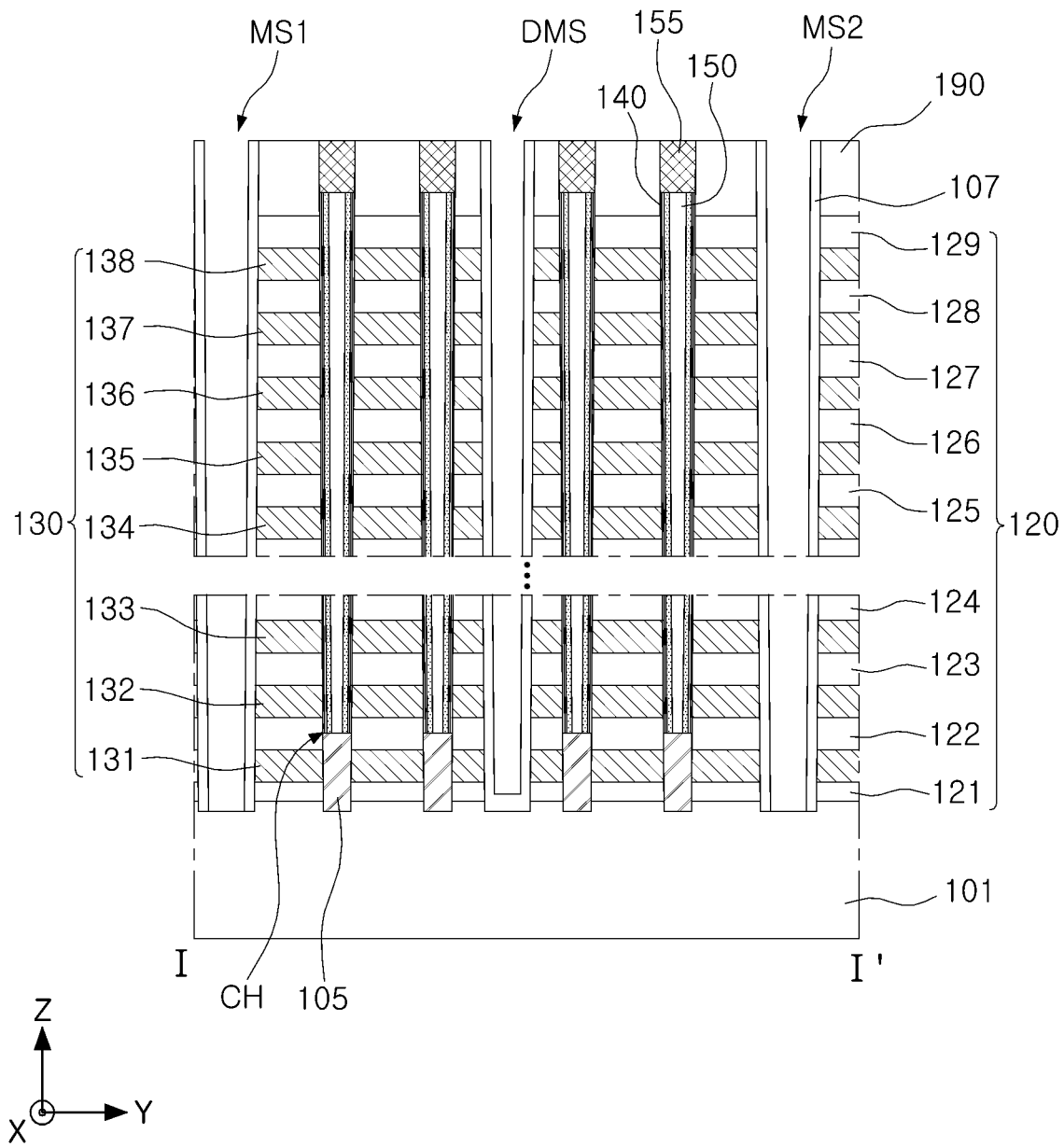

Referring to FIGS. 12A and 12B, gate electrodes of the gate electrode stack 130 may be formed by filling regions formed by removing the sacrificial layers 180 with a conductive material, and an insulating layer 170 may be formed in the first and second isolation regions MS1 and MS2 and the auxiliary isolation regions DMS.

Each of the gate electrodes of the gate electrode stack 130 may include a metal, polycrystalline silicon, or a metal silicide material. The auxiliary isolation regions DMS may provide a transfer path of the material forming the gate electrode stack 130 together with the first and second isolation regions MS1 and MS2. Filling of the gate electrodes of the gate electrode stack 130 may be effectively performed by the auxiliary isolation regions DMS even when a spacing distance between the first and second isolation regions MS1 and MS2 in a Y direction is relatively large. Since the auxiliary isolation regions DMS are not in the form of trenches continuously extending as in the first and second isolation regions MS1 and MS2, the gate electrodes of the gate electrode stack 130 may be connected between adjacent auxiliary isolation regions DMS, and thus, the stacked structure including the gate electrode stack 130 may be prevented from leaning due to stress caused by a material forming the gate electrode stack 130. After the gate electrode stack 130 is formed, the material of the gate electrode stack 130 deposited in the first and second isolation regions MS1 and MS2 and the auxiliary isolation regions DMS may be removed through an additional process.

Then, the insulating layer 107 may be formed in the first and second isolation regions MS1 and MS2 and the auxiliary isolation regions DMS. In the first and second isolation regions MS1 and MS2, the insulating layer 107 may be formed in the form of a spacer. For example, after an insulating material is deposited, the insulating material formed on the substrate 101 may be removed from lower portions of the first and second isolation regions MS1 and MS2. In this exemplary embodiment, in the case of the auxiliary isolation regions DMS having a relatively small size, a thickness of the insulating material formed on the substrate 101 may be relatively great such that the insulating material may remain in lower portions of the auxiliary isolation regions without being completely removed therefrom. Thus, in the case of the auxiliary isolation regions DMS, the insulating layer 107 may be formed to cover an upper surface of the substrate 101, in a manner different from the first and second isolation regions MS1 and MS2.

Then, a conductive layer 110 may be deposited on the insulating layer 107, such that the semiconductor device 100 illustrated in FIGS. 3 to 4D may be manufactured.

Figure 13:
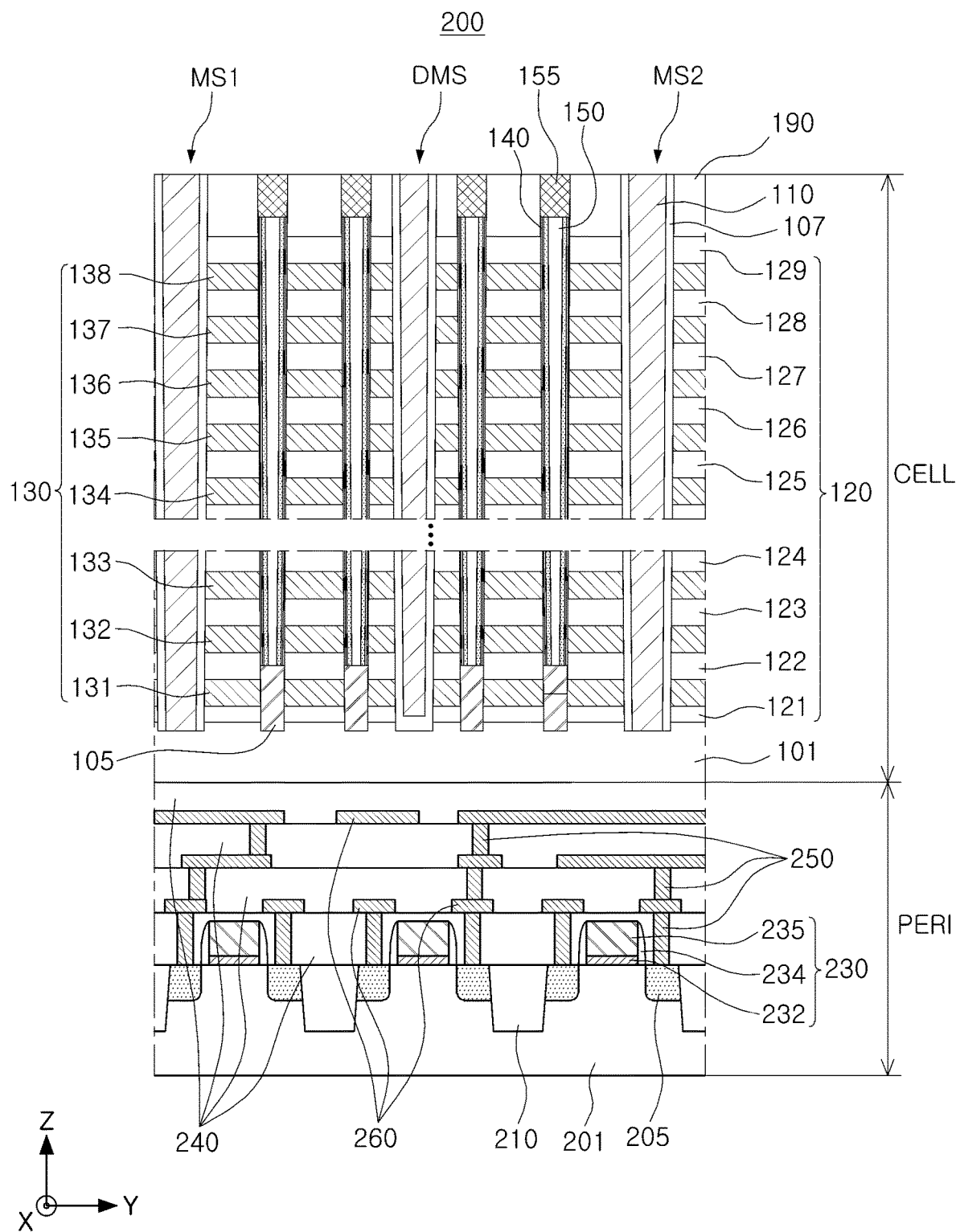
FIG. 13 is a schematic cross-sectional view of a semiconductor device according to example embodiments.

FIG. 13 is a schematic cross-sectional view of a semiconductor device according to example embodiments.

Referring to FIG. 13, a semiconductor device 200 may include a memory cell region CELL and a peripheral circuit region PERI. The memory cell region CELL may be disposed on an upper end of the peripheral circuit region PERI. According to example embodiments, the memory cell region CELL may also be disposed on a lower end of the peripheral circuit region PERI.

The memory cell region CELL may include a substrate 101, gate electrode stack 130 stacked on the substrate 101, channels CH arranged to penetrate through the gate electrode stack 130, first and second isolation regions MS1 and MS2 extending while penetrating through the gate electrode stack 130, and string isolation regions SS and a plurality of auxiliary isolation regions DMS penetrating through portions of the gate electrode stack 130, as described above with reference to FIGS. 3 to 4D. In the example embodiment, the memory cell region CELL may be illustrated as having the same structure as the example embodiment of FIGS. 3 to 4D, but is not limited thereto. The memory cell region CELL may have a structure according to various embodiments, for example, as described above with reference to FIGS. 6 to 7b.

The peripheral circuit region PERI may include a base substrate 201, circuit elements 230 disposed on the base substrate 201, contact plugs 250, and wiring lines 260. The wiring lines described above may also be formed of a conductive material, for example, a metal.

The base substrate 201 may have an upper surface extended in X and Y directions. In the base substrate 201, device isolation layers 210 may be formed to define active regions. Doping regions 205 including impurities may be disposed in a portion of the active regions. The base substrate 201 may include a semiconductor material, for example, a group IV semiconductor material, a group III-V compound semiconductor material, or a group II-VI oxide semiconductor material.

The circuit elements 230 may include a planar transistor. Each of the circuit elements 230 may include a circuit gate insulating layer 232, a spacer layer 234, and a circuit gate electrode 235. The doping regions 205 may be disposed in the base substrate 201 on both sides of the circuit gate electrode 235 to serve as a source region or a drain region of the circuit element 230.

A plurality of peripheral-region insulating layers 240 may be disposed on the circuit elements 230, above the base substrate 201. The contact plugs 250 may penetrate through the peripheral-region insulating layers 240 to be connected to the doping regions 205. An electrical signal may be applied to the circuit elements 230 via the contact plugs 250. The contact plugs 250 may also be connected to the circuit gate electrodes 235 in a region not illustrated in the drawing. The wiring lines 260 may be connected to the contact plugs 250, and may be arranged in a plurality of layers.

In the case of the semiconductor device 200, after the peripheral circuit region PERI is first formed, the substrate 101 of the memory cell region CELL may be formed thereon to form the memory cell region CELL. The substrate 101 may have the same size as that of the base substrate 201, or may be formed to have a size smaller than that of the base substrate 201. The memory cell region CELL and the peripheral circuit region PERI may be connected to each other in a region not illustrated in the drawing. For example, one end of the gate electrode 130 stack in an X direction may be electrically connected to the circuit element 230.

By disposing a plurality of auxiliary isolation regions between isolation regions, a semiconductor device having improved reliability may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
a substrate having a first region and a second region;
a gate electrode stack having a plurality of gate electrodes vertically stacked and spaced apart from each other in a first direction perpendicular to an upper surface of the substrate in the first region, and extending to have different lengths in a second direction parallel to the upper surface of the substrate from the first region to the second region;
first and second isolation regions extending in the second direction, while penetrating through the gate electrode stack, in the first and second regions;
string isolation regions disposed between the first isolation region and the second isolation region only in the first region, and extending in the second direction while penetrating through at least one uppermost gate electrode of the gate electrode stack; and
a plurality of auxiliary isolation regions disposed linearly with the string isolation regions in the first and second regions, and spaced apart from each other in the second direction while penetrating a portion of the gate electrode stack.

2. The semiconductor device of claim 1,
wherein the string isolation regions are alternately arranged with the plurality of auxiliary isolation regions in the first region.

3. The semiconductor device of claim 1,
wherein the plurality of auxiliary isolation regions are disposed to have two or more spacing distances different from each other.

4. The semiconductor device of claim 1,
wherein a width of each of the plurality of auxiliary isolation regions in a third direction perpendicular to the first and second directions is equal to or narrower than a width of each of the first and second isolation regions in the third direction.

5. The semiconductor device of claim 1,
wherein a width of each of the plurality of auxiliary isolation regions in a third direction perpendicular to the first and second directions is greater than a width of each of the string isolation regions in the third direction.

6. The semiconductor device of claim 1,
wherein each of the first and second isolation regions and each of the plurality of auxiliary isolation regions comprise an insulating layer and a conductive layer filling the insulating layer, and
the conductive layer is in contact with the substrate to be connected the substrate in the first and second isolation regions, and is disposed to be spaced apart from the substrate by the insulating layer in the plurality of auxiliary isolation regions.

7. The semiconductor device of claim 1,
wherein lateral surfaces of each of the plurality of auxiliary isolation regions in the first region are in contact with lateral surfaces of the string isolation regions.

8. The semiconductor device of claim 1,
wherein the plurality of auxiliary isolation regions in the second region are spaced apart from the string isolation regions.

9. The semiconductor device of claim 1,
wherein the at least one of the plurality of gate electrodes is partially divided into a first portion and a second portion divided by the corresponding auxiliary isolation region in the second region, and
wherein the first portion and the second portion is connected between the corresponding auxiliary isolation region and another auxiliary isolation region adjacent thereto.

10. A semiconductor device comprising:
a substrate having a first region and a second region;
a gate electrode stack having a plurality of gate electrodes vertically stacked and spaced apart from each other in a first direction perpendicular to an upper surface of the substrate in the first region, and extending to have different lengths in a second direction parallel to the upper surface of the substrate from the first region to the second region;
first and second isolation regions extending in the second direction, while penetrating through the gate electrode stack, in the first and second regions;
string isolation regions disposed between the first isolation region and the second isolation region only in the first region, and extending in the second direction while penetrating through at least one uppermost gate electrode of the gate electrode stack; and a plurality of auxiliary isolation regions disposed linearly with the string isolation regions in the second region, and spaced apart from each other in the second direction while penetrating a portion of the gate electrode stack.

11. The semiconductor device of claim 10, wherein the plurality of auxiliary isolation regions are spaced apart from the string isolation regions.

12. The semiconductor device of claim 10, wherein the plurality of auxiliary isolation regions are disposed to have two or more spacing distances different from each other.

13. The semiconductor device of claim 10, wherein a width of each of the plurality of auxiliary isolation regions in a third direction perpendicular to the first and second directions is equal to or narrower than a width of each of the first and second isolation regions in the third direction.

14. The semiconductor device of claim 10, wherein a width of each of the plurality of auxiliary isolation regions in a third direction perpendicular to the first and second directions is greater than a width of each of the string isolation regions in the third direction.

15. The semiconductor device of claim 10, wherein each of the first and second isolation regions and each of the plurality of auxiliary isolation regions comprise an insulating layer and a conductive layer filling the insulating layer, and the conductive layer is in contact with the substrate to be connected the substrate in the first and second isolation regions, and is disposed to be spaced apart from the substrate by the insulating layer in the plurality of auxiliary isolation regions.

* * * * *